(12) United States Patent
Park

(10) Patent No.: US 11,262,625 B2
(45) Date of Patent: Mar. 1, 2022

(54) DISPLAY DEVICE

(71) Applicant: Samsung Display Co., Ltd., Yongin-si (KR)

(72) Inventor: Jae Hyun Park, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 57 days.

(21) Appl. No.: 16/821,865

(22) Filed: Mar. 17, 2020

(65) Prior Publication Data
US 2021/0063801 A1 Mar. 4, 2021

(30) Foreign Application Priority Data

Sep. 2, 2019 (KR) .................. 10-2019-0108399

(51) Int. Cl.
G02F 1/1345 (2006.01)
G02F 1/1343 (2006.01)
(Continued)

(52) U.S. Cl.
CPC ........ G02F 1/13452 (2013.01); G02F 1/1368 (2013.01); G02F 1/13394 (2013.01); G02F 1/133345 (2013.01); G02F 1/133514 (2013.01); G02F 1/134309 (2013.01); H01L 27/124 (2013.01); H01L 27/1222 (2013.01);
(Continued)

(58) Field of Classification Search
CPC ............. H01L 27/3276; H01L 27/124; H01L 27/1248; H01L 27/1222; H01L 27/3248; H01L 27/322; H01L 27/3246; H01L 27/3262; H01L 29/78675; G02F 1/1345; G02F 1/13456; G02F 1/13452; G02F 1/1333; G02F 1/133345; G02F 1/133514; G02F 1/133512; G02F 1/1339; G02F 1/13394; G02F 1/1343; G02F 1/134309; G02F 1/13439; G02F 1/13458; G02F 1/1368; G02F 1/1362; G02F 1/136222;
(Continued)

(56) References Cited

U.S. PATENT DOCUMENTS 9,947,652 B2 4/2018 Choi et al.
10,209,597 B1 2/2019 Shen et al.
(Continued)

FOREIGN PATENT DOCUMENTS

KR 1999-0081573 11/1999
KR 10-2015-0047711 5/2015
(Continued)

Primary Examiner — Thoi V Duong
(74) Attorney, Agent, or Firm — H.C. Park & Associates, PLC

(57) ABSTRACT

A display device including: a first substrate including a first base substrate and a lower pad disposed on one end of the first base substrate on a side; a second substrate disposed above the first substrate and including a second base substrate and an upper pad disposed on an end of the second base substrate on the side; a side pad electrically connected to the lower pad and the upper pad; and a sealing member disposed between the first substrate and the second substrate. The sealing member includes an insulating resin and conductive balls dispersed in the insulating resin, and the upper pad and the lower pad are electrically connected to each other through the conductive balls.

21 Claims, 25 Drawing Sheets

(51) Int. Cl.
  *G02F 1/1362* (2006.01)
  *G02F 1/1339* (2006.01)
  *G02F 1/1368* (2006.01)
  *G02F 1/1333* (2006.01)
  *G02F 1/1335* (2006.01)
  *H01L 27/12* (2006.01)
  *H01L 29/786* (2006.01)

(52) U.S. Cl.
  CPC .... *H01L 27/1248* (2013.01); *H01L 29/78675* (2013.01); *G02F 1/136222* (2021.01); *G02F 1/136227* (2013.01); *G02F 2201/121* (2013.01); *G02F 2201/123* (2013.01)

(58) Field of Classification Search
  CPC ......... G02F 1/136227; G02F 2201/121; G02F 2201/123
  See application file for complete search history.

(56) References Cited

U.S. PATENT DOCUMENTS

| | | | |
|---|---|---|---|
| 10,495,931 B2 | 12/2019 | Son et al. | |
| 2010/0134745 A1* | 6/2010 | Lee | G02F 1/13458 |
| | | | 349/153 |
| 2017/0160574 A1* | 6/2017 | Yamaguchi | G02F 1/13306 |

FOREIGN PATENT DOCUMENTS

| | | |
|---|---|---|
| KR | 10-2017-0005341 | 1/2017 |
| KR | 10-2018-0028097 | 3/2018 |

\* cited by examiner

DISPLAY DEVICE

CROSS REFERENCE TO RELATED APPLICATION

This application claims priority from and the benefit of Korean Patent Application No. 10-2019-0108399, filed on Sep. 2, 2019, which is hereby incorporated by reference for all purposes as if fully set forth herein.

BACKGROUND

Field

Exemplary embodiments of the invention relate generally to a display device.

Discussion of the Background

Display devices have become more and more important as multimedia technology evolves. Accordingly, a variety of display devices, such as liquid crystal display (LCD) devices and organic light-emitting diode display (OLED) devices, are currently being developed.

There is a region where a drive IC or other printed circuits are disposed on the outer periphery of the glass substrate of a display device. This region may be referred to as a "bezel", which is a non-display area where no image is displayed.

The above information disclosed in this Background section is only for understanding of the background of the inventive concepts, and, therefore, it may contain information that does not constitute prior art.

SUMMARY

Exemplary embodiments of the invention provide a display device in which the contact resistance between a pad of a display panel and a lead of a printed circuit board disposed on a side of the display panel is reduced.

Additional features of the inventive concepts will be set forth in the description which follows, and in part will be apparent from the description, or may be learned by practice of the inventive concepts.

An exemplary embodiment of the invention provides a display device including a first substrate including a first base substrate and a lower pad disposed on one end of the first base substrate on a side; a second substrate disposed above the first substrate and including a second base substrate and an upper pad disposed on an end of the second base substrate on the side; a side pad electrically connected to the lower pad and the upper pad; and a sealing member disposed between the first substrate and the second substrate. The sealing member includes an insulating resin and conductive balls dispersed in the insulating resin, and the upper pad and the lower pad are electrically connected to each other through the conductive balls.

The first substrate may include a display area and a non-display area positioned around the display area, and the sealing member, the lower pad, and the upper pad may be disposed in the non-display area.

The first substrate may include a first conductive layer disposed on the first base substrate and including a gate electrode of a thin-film transistor, and a second conductive layer disposed on the first conductive layer and including a source electrode and a drain electrode of the thin-film transistor. The lower pad may include a first lower pad and a second lower pad disposed on the first lower pad, and the first conductive layer may include the first lower pad while the second conductive layer may include the second lower pad.

The outer surfaces of the first lower pad, the second lower pad, and the upper pad may be aligned with one another in a thickness direction.

The first substrate may further include a first insulating layer disposed between the first conductive layer and the second conductive layer, a second insulating layer disposed on the second conductive layer, and a color filter disposed between the second insulating layer and the first insulating layer, and the color filter may be disposed in the display area.

The first substrate may further include a first column spacer disposed on a same layer as the color filter and overlapping the lower pad, and the second substrate may further include a second column spacer disposed between the first column spacer and the upper pad.

The first column spacer may be in direct contact with the second column spacer.

The outer surfaces of the first column spacer and the second column spacer may be located more to the inside than outer surfaces of the upper pad and the lower pad.

The side pad may be in direct contact with the outer surface of the first column spacer and the outer surface of the second column spacer.

The first lower pad may be in direct contact with the second lower pad.

The first substrate may further include a third conductive layer disposed on the second conductive layer and including a pixel electrode defining each pixel in the display area.

The first substrate may further include a connection electrode disposed between the sealing member and the second insulating layer, and the third conductive layer includes the connection electrode. The connection electrode penetrates through the second insulating layer and the first insulating layer to be connected to the first lower pad.

The conductive balls of the sealing member may electrically connect the connection electrode with the upper pad.

The lower pad may further include a third lower pad disposed between the first column spacer and the second column spacer, and the third conductive layer may further include the third lower pad.

The second insulating layer may be extended to between the first column spacer and the second lower pad.

The lower pad may further include a third lower pad disposed between the first column spacer and the second column spacer, and the third lower pad may be connected to the second lower pad through a contact hole formed through the second insulating layer.

The second lower pad may be connected to the first lower pad through a contact hole penetrating through the first insulating layer.

The second substrate may further include a common electrode disposed on the second base substrate, and the common electrode and the upper pad may be disposed on the same layer but may be spaced apart from each other.

Another exemplary embodiment provides a first substrate including a first base substrate, a first conductive layer disposed on the first base substrate and including a gate electrode of a thin-film transistor and a first lower pad, a first insulating layer disposed on the first conductive layer, a second conductive layer disposed on the first insulating layer and including a source electrode and a drain electrode of the thin-film transistor, and a second lower pad disposed on the first lower pad, a second insulating layer disposed on the second conductive layer, and a third conductive layer disposed on the second insulating layer and including a pixel electrode connected to the source electrode or the drain electrode of the thin-film transistor; and a second substrate disposed above the first substrate and comprising a second base substrate and an upper pad disposed on the second base substrate; a side pad electrically connected to the lower pad and the upper pad; and a sealing member disposed between the first substrate and the second substrate. The sealing member includes an insulating resin and conductive balls dispersed in the insulating resin, the first substrate further includes a connection electrode disposed between the sealing member and the second insulating layer, the connection electrode is be connected to the first lower pad through the second insulating layer and the first insulating layer, and the connection electrode and the upper pad are electrically connected to each other through the conductive balls.

The display device may further include a printed circuit board attached to the side pad.

The connection electrode may be disposed on the same layer as the pixel electrode.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
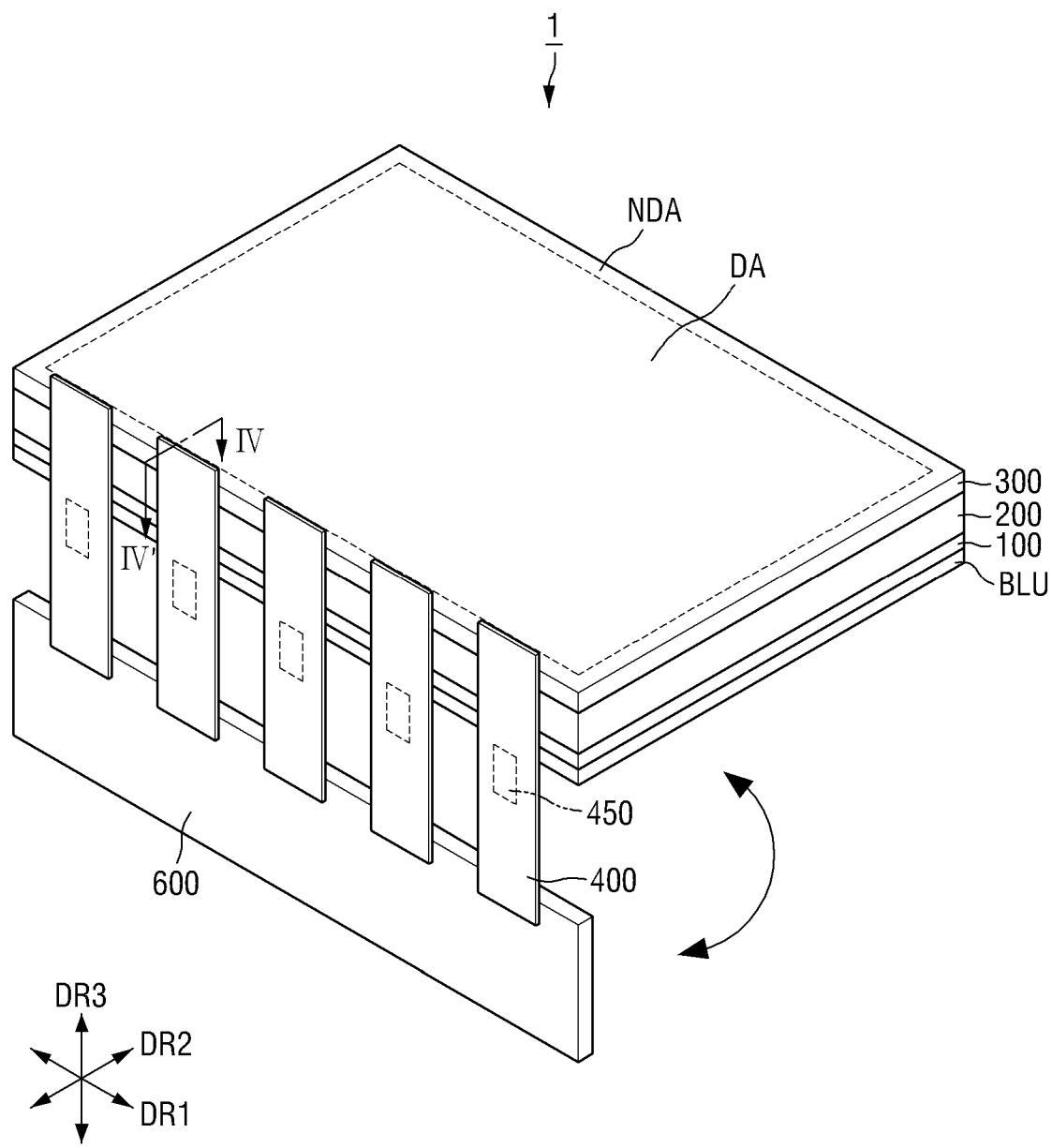
FIG. 1 is a perspective view of a display device according to an exemplary embodiment of the invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, exemplary embodiments of the present disclosure will be described with reference to the accompanying drawings.

Figure 2:
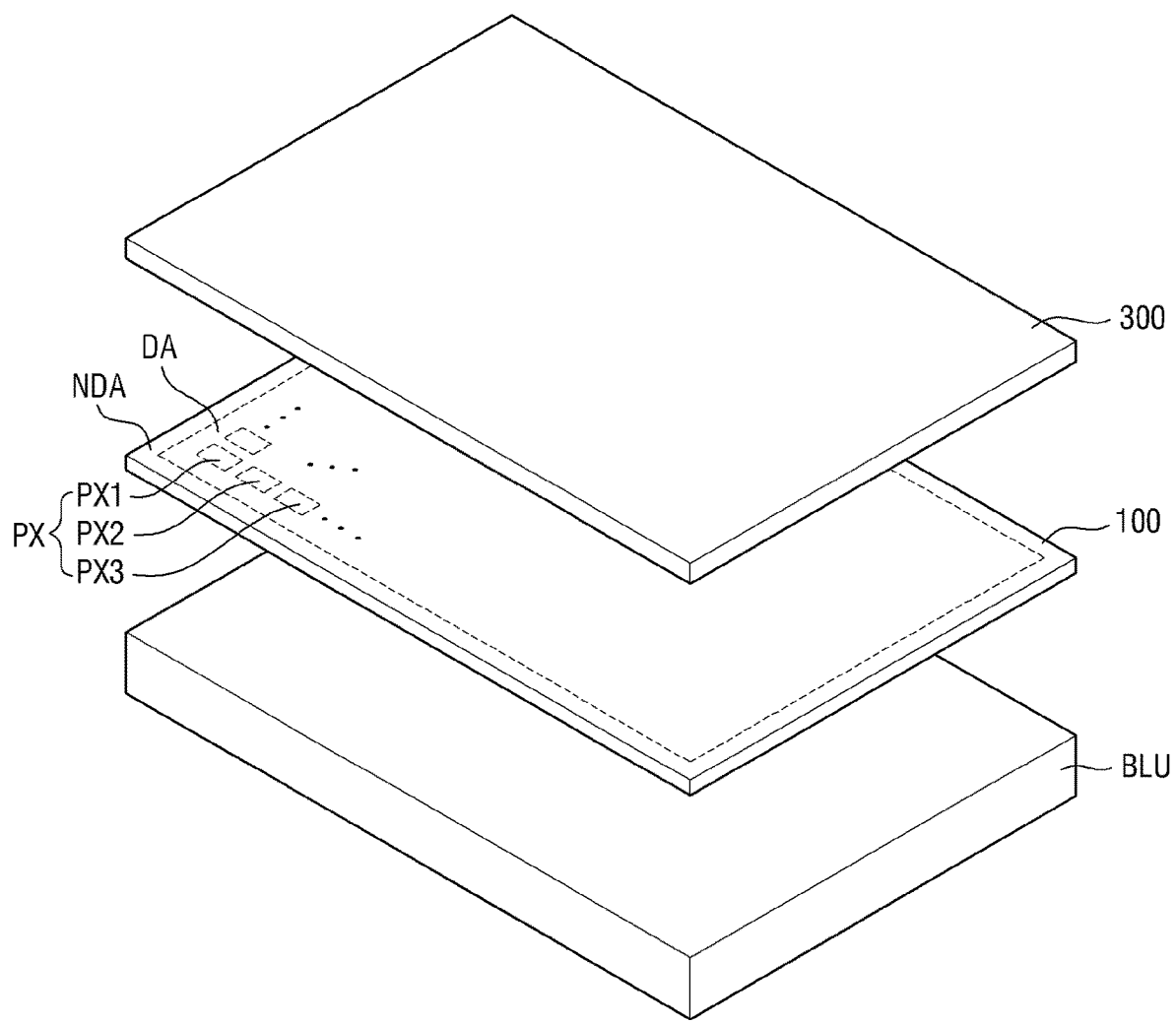
FIG. 2 is an exploded perspective view of a part of the display device shown in FIG. 1.

FIG. 1 is a perspective view of a display device according to an exemplary embodiment of the invention. FIG. 2 is an exploded perspective view of a part of the display device shown in FIG. 1.

In the following description, a liquid crystal display device including a liquid crystal layer is employed as the display device, but the inventive concepts are not limited thereto.

A display device according to an exemplary embodiment of the invention may be used in a large electronic device, such as a television and an electric board, as well as in small and medium electronic devices, such as a personal computer, a laptop computer, a vehicle navigation device and a camera, etc. In addition, the display device may be used in a tablet PC, a smart phone, a personal digital assistant (PDA), a portable multimedia player (PMP), a game device, a wrist-watch-type electronic device, etc. The above-listed electronic devices are merely illustrative, and the display device may be employed in other display devices.

Referring to FIG. 1, a display device 1 according to an exemplary embodiment may have a rectangular shape having long and short sides. For example, the long sides of the display device 1 may be extended in a first direction DR1 while the short sides thereof may be extended in a second direction DR2. Although the corners of the display device 1 where the long sides and the short sides meet may form a right angle, this is merely illustrative. The display device 1 may have rounded corners.

In some exemplary embodiments, the shape of the display device 1 may include a square, a circle, an oval, or other polygon when viewed from the top in a plan view.

In some exemplary embodiments, the display device 1 may be employed by a tiled display apparatus (Public Information Display (PID) or Tiled Display (TD)). In such case, a longer side or a shorter side of each display device 1 of the tiled display apparatus may be connected to one another. Some of the display devices 1 may form a side of the tiled display apparatus, some others of the display devices 1 may be located at the corners of the tiled display apparatus to form two adjacent sides, and some others of the display devices 1 may be located on the inner side of the tiled display apparatus and surrounded by the other display devices 1. The display devices 1 may have different bezel shapes depending on the locations, or may have the same bezel shape.

In an exemplary embodiment, the plurality of display devices 1 may be arranged in a lattice pattern, but the inventive concepts are not limited thereto. The display devices 1 may be connected in the first direction DR1 or the second direction DR2 or may be connected in a particular pattern. The display devices may have the same size, but the inventive concepts are not limited thereto. The display devices may have different sizes.

The tiled display apparatus may have a flat shape, but the inventive concepts are not limited thereto. The tiled display apparatus may have a three-dimensional shape to provide a three-dimensional effect. When the tiled display apparatus has a three-dimensional shape, each of the display devices 1 included in the tiled display apparatus may have a curved shape, or may be connected to one another in a planar shape or at a predetermined angle, such that the tiled display apparatus may be formed in the three-dimensional shape.

The bezels of the plurality of display devices 1 may be connected with one another directly or may be connected with one another by a connecting member (not shown). As such, since the display devices 1 are connected with one another in the tiled display apparatus, two bezels of the adjacent display devices 1 are disposed together at each connection portion. Therefore, each of the display devices 1 is required to have a thin bezel. To this end, a side connection pad may be disposed.

Hereinafter, display devices 1 according to exemplary embodiments of the invention that can be used alone will be described in detail.

Referring to FIG. 2, each of the display devices 1 may include a display panel, a backlight unit BLU disposed under the display panel, a printed circuit board 400 disposed on a side surface of the display panel, and a main circuit board 600 connected to the printed circuit board 400.

The display panel may include a first substrate 100, a liquid crystal layer 200, and a second substrate 300.

The first substrate 100, the second substrate 300 and the backlight unit BLU may have a rectangular shape that has long sides in the first direction DR1 and short sides in the second direction DR2 perpendicular to the first direction DR1. It is, however, to be understood that the shapes of the first substrate 100, the second substrate 300, and the backlight unit BLU are not limited thereto. Some portions of the first substrate 100, the second substrate 300, and the backlight unit BLU may have curved portions as desired.

The backlight unit BLU may generate light and may provide the generated light to the first substrate 100, the liquid crystal layer 200, and the second substrate 300. The display panel including the first substrate 100, the liquid crystal layer 200, and the second substrate 300 may generate an image using the light provided from the backlight unit BLU, and may provide it to the outside.

The first substrate 100 may include a display area DA where images are displayed, and a non-display area NDA where no image is displayed. The non-display area NDA may surround the display area DA, for example. Although not shown in the drawings, the display device 1 may further include a window member on the second substrate 300, which covers the display panel and transmits an image to the outside. As shown in FIG. 2, a plurality of pixels PX1, PX2, and PX3 may be disposed in the display area DA. The plurality of pixels PX1, PX2, and PX3 may be arranged in a matrix along in the first direction D1 and the second direction D2. The first pixels PX1 may emit light in a red wavelength range (e.g., the peak wavelength of approximately 610 to 650 nm). The second pixels PX2 may emit light in a green wavelength range (e.g., the peak wavelength of approximately 510 to 550 nm). The third pixels PX3 may emit light in a blue wavelength range (e.g., the peak wavelength of approximately 430 to 470 nm).

The pixels PX1, PX2, and PX3 in the display area DA are illustrated as being arranged repeatedly in the first direction DR1, but the inventive concepts are not limited thereto.

A non-exiting area PB may be disposed around each of the pixels PX1, PX2, and PX3 in the display area DA. The non-exiting area PB may surround each of the pixels PX1, PX2, and PX3 in the display area DA when viewed from the top in a plan view.

Each of the pixels PX1, PX2, and PX3 in the display area DA may be defined as an area overlapping with a pixel electrode 161 (see FIG. 3) of the first substrate 100, as described below. Typically, each of the pixels PX1, PX2 and PX3 refers to an area from which light provided from the first substrate 100 can exit. However, a part of each of the pixels PX1, PX2, and PX3 may overlap with a light-blocking layer 310 (see FIG. 3), as will be described below. In the part of each of the pixels PX1, PX2, and PX3 overlapping the light-blocking pattern 310, light provided from the first substrate 100 may not exit.

In the non-display area NDA, a sealing member SEAL coupling the first substrate 100 with the second substrate 300 may be disposed. In other words, the sealing member SEAL may be disposed between the first substrate 100 and the second substrate 300. The sealing member SEAL will be described in detail later.

The backlight unit BLU may be, for example, an edge-lit backlight unit or a direct-lit backlight unit, but the exemplary embodiments of the present disclosure are not limited thereto.

Although not shown in the drawings, the first substrate 100 may include a plurality of lower pads 123 and 135 (see FIG. 4), extending toward one end of the display panel shown in FIGS. 1 and 2 (one end on the longer side in the second direction DR2). A first lower pad 123 of the lower pads may be extended from the display area DA of the first substrate 100 to the non-display area NDA at one end of the display panel. More than one first lower pad 123 may be disposed. The plurality of first lower pads 123 may be electrically connected to the thin-film transistors of the pixels PX1, PX2, and PX3, respectively.

The first lower pads 123 may be spaced apart from each other along the first direction DR1. More than one second lower pad 135 may be disposed on the first lower pads 123, respectively, like the first lower pads 123 in line with them in the thickness direction, and the second lower pads 135 may be spaced apart from one another in the first direction DR1.

The printed circuit board 400 may be disposed on a side surface of one end (long side) of the display panel. More than one printed circuit boards 400 may be disposed as shown in FIG. 1. The printed circuit boards 400 may be spaced apart from each other in the first direction DR1.

It is, however, to be understood that the inventive concepts are not limited thereto. The printed circuit boards 400 may be disposed on the long side of an end and on the long side of the other end of the display panel and may also be disposed on the short side of the display panel. In addition, the printed circuit boards 400 may be disposed on the long side and the short side of the display panel, respectively.

Each of the printed circuit boards 400 may include a drive integrated circuit 450. The drive integrated circuit 450 may be employed as a data drive chip. According to an exemplary embodiment of the invention, the drive integrated circuit 450 serves as a data drive chip and employed as a chip-on film (COF) formed on the printed circuit board 400.

The main circuit board 600 may be connected to the printed circuit boards 400. The main circuit board 600 may include, for example, a timing controller (not shown). The timing controller may be mounted on the main circuit board 600 in the form of an integrated circuit chip and electrically connected to the drive integrated circuit 450. The timing controller may output a gate control signal, a data control signal, and image data.

The drive integrated circuit 450 may receive image data and a data control signal from the timing controller. The drive integrated circuit 450 may generate analog data voltages corresponding to the image data in response to the data control signal, to output them. Each of the pixels PX1, PX2, and PX3 in the display area DA may receive the data voltages in response to gate signals provided through gate lines of the first substrate 100. Each of the pixels PX1, PX2, and PX3 represents a grayscale level corresponding to the data voltages, thereby controlling transmittance of the area in which the pixels PX1, PX2 and PX3 are disposed.

Figure 3:
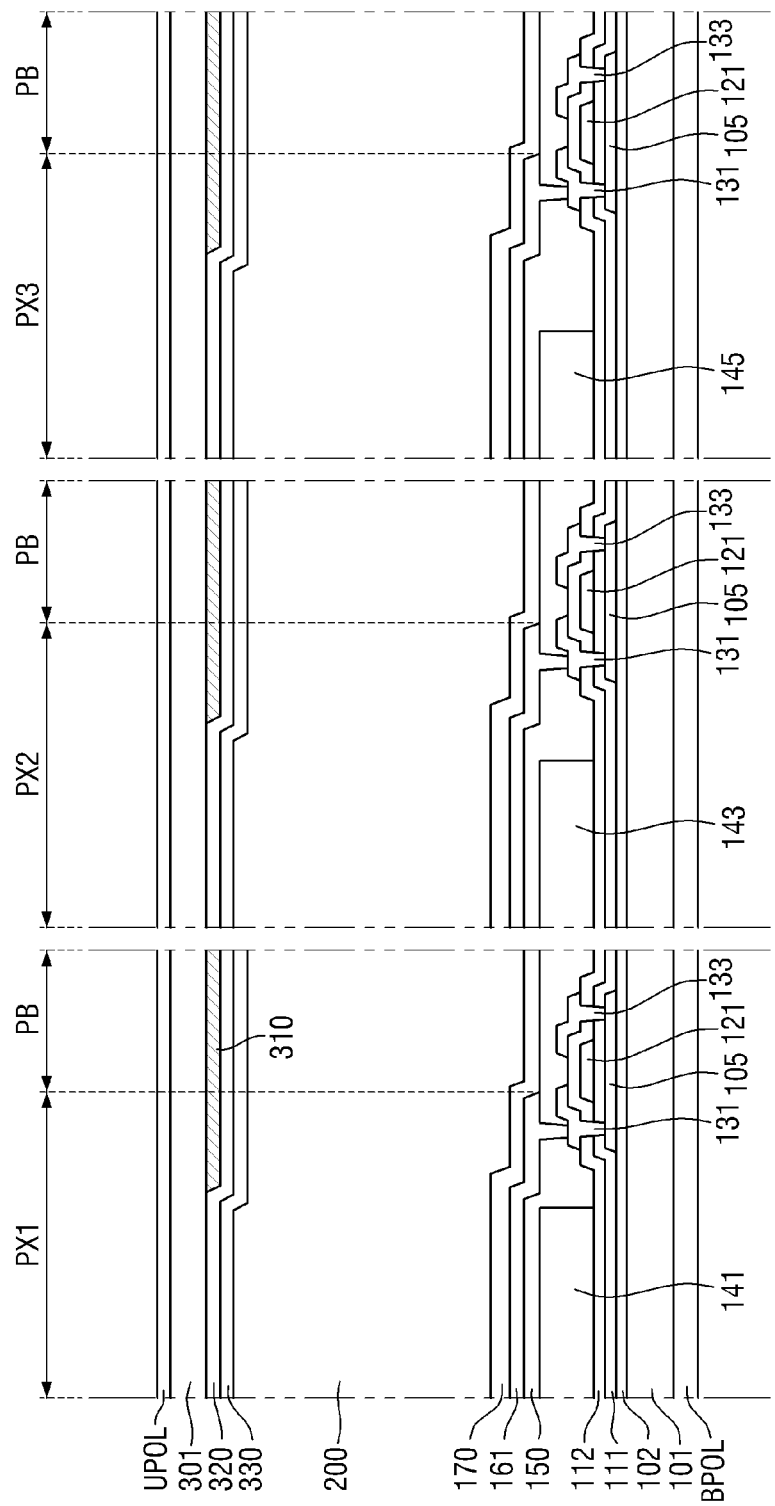
FIG. 3 is a cross-sectional view showing a first pixel, a second pixel, and a third pixel.
Figure 4:
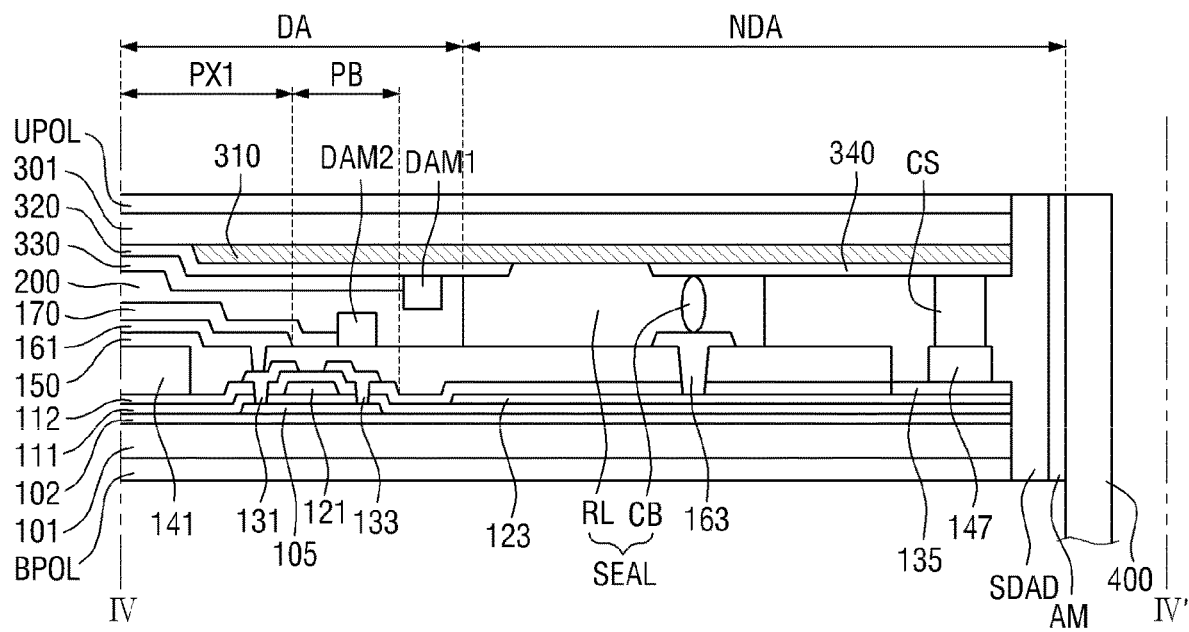
FIG. 4 is a cross-sectional view taken along line IV-IV' of FIG. 1.
Figure 5:
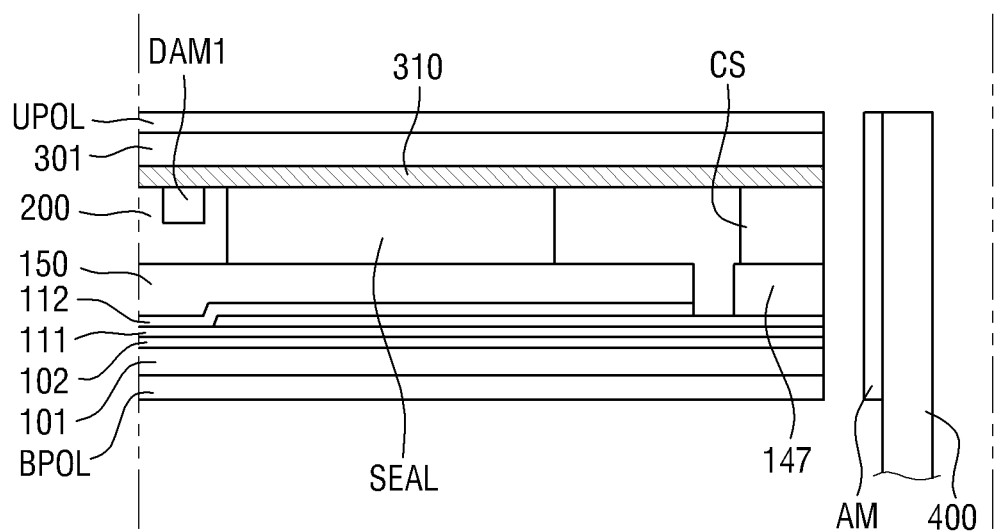
FIG. 5 is a different cross-sectional view of the display device of FIG. 1.

FIG. 3 is a cross-sectional view showing a first pixel, a second pixel, and a third pixel. FIG. 4 is a cross-sectional view taken along line IV-IV' of FIG. 1. FIG. 5 is a different cross-sectional view of the display device. FIG. 3 shows not only the pixels PX1, PX2, and PX3 but also the non-exiting area PB located adjacent to each of the pixels PX1, PX2, and PX3. FIG. 4 is a cross-sectional view of a portion where the lower pads 123 and 135 of on the first substrate 100 are disposed. FIG. 5 is a cross-sectional view of a portion where the lower pads 123 and 135 are not disposed.

Referring to FIGS. 3 to 5, the display panel may include the first substrate 100, the second substrate 300 disposed above the first substrate 100, and the liquid crystal layer disposed between the first substrate 100 and the second substrate 500. The display panel may further include the sealing member SEAL and a column spacer CS disposed between the first substrate 100 and the second substrate 300. The first substrate 100 and the second substrate 300 may be disposed over the display area DA and the non-display area NDA positioned around the display area DA.

The first substrate 100 may include a first base substrate 101, a buffer layer 102 disposed on the first base substrate 101, a semiconductor layer 105 disposed on the buffer layer 102, a first insulating layer 111 disposed on the semiconductor layer 105, a first conductive layer disposed on the first insulating layer 111, a second insulating layer 112 disposed on the first conductive layer, a second conductive layer disposed on the second insulating layer 112, color filter layers 141, 143 and 145 disposed on the second conductive layer, a third insulating layer 150 disposed on the color filter layers 141, 143 and 145, a third conductive layer disposed on the third insulating layer 150, and a lower alignment layer 170 and a second dam DAM2 are disposed on the third conductive layer.

In an exemplary embodiment, the first base substrate 101 may be a transparent insulating substrate. Herein, the transparent insulating substrate may include a glass material, a quartz material, or a transparent plastic material. According to another exemplary embodiment, the first base substrate 101 may be a flexible substrate, or may have a shape in which a plurality of films and the like are stacked.

The buffer layer 102 may be disposed on the first base substrate 101. The buffer layer 102 can prevent moisture and oxygen from permeating into the first base substrate 101 from the outside. The buffer layer 102 may include at least one of a silicon nitride ($SiN_x$) layer, a silicon oxide ($SiO_2$) layer, and a silicon oxynitride ($SiO_xN_y$) layer.

The semiconductor layer 105 may be disposed on the buffer layer 102. The semiconductor layer 105 forms a channel of a thin-film transistor. The semiconductor layer 105 may be disposed in each of the pixels PX1, PX2, and PX3 in the display area DA, and may be disposed in the non-display area NDA in some implementations. The semiconductor layer 105 may include source/drain regions and an active region. The semiconductor layer 105 may include, but is not limited to, polycrystalline silicon.

A first insulating layer 111 may be disposed on the semiconductor layer 105. The first insulating layer 111 may be disposed on the whole surface of the first base substrate 101. The first insulating layer 111 may be a gate insulating layer having a gate insulating function. The first insulating layer 111 may include a silicon compound, a metal oxide, etc. For example, the first insulating layer 111 may include silicon oxide, silicon nitride, silicon oxynitride, aluminum oxide, tantalum oxide, hafnium oxide, zirconium oxide, titanium oxide, etc. They may be used alone or in combinations.

The first conductive layer may be disposed on the first insulating layer 111. The first conductive layer may include a gate electrode 121 and the first lower pads 123 of the thin-film transistor. The gate electrode 121 may be disposed in each of the pixels PX1, PX2, and PX3.

The first lower pad 123 may be disposed across the display area DA and the non-display area NDA. The first lower pad 123 may be extended to one end of the first base substrate 101 adjacent to the printed circuit board 400. The outer surface of the first lower pad 123 may be aligned with the side surface of one end of the first base substrate 101.

The first conductive layer may include at least one metal selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The first conductive layer may be made up of a single layer or multiple layers of the above-listed materials.

The second insulating layer 112 may be disposed on the first conductive layer. The second insulating layer 112 may insulate the first conductive layer from the second conductive layer. The second insulating layer 112 may be selected from among the above-listed materials of the first insulating layer 112. The second insulating layer 112 may be disposed on the entire surface of the display area DA and a part of the non-display area NDA. The second insulating layer 112 may expose the upper surface of the first lower pad 123 on one end of the non-display area NDA.

The second conductive layer may be disposed on the second insulating layer 112. The second conductive layer may include a source electrode 131, a drain electrode 133, and a second lower pad 135 of the thin-film transistor. The source electrode 131 and the drain electrode 133 may be electrically connected to a source region and a drain region of the semiconductor layer 105 through contact holes penetrating through the second insulating layer 112 and the first insulating layer 111, respectively.

The second conductive layer may include at least one selected from the group consisting of: molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W) and copper (Cu). The second conductive layer may be made up of a single layer of the above-listed materials. It is, however, to be understood that the inventive concepts are not limited thereto. The second conductive layer may be a stack of multiple layers. For example, the second conductive layer may have a stack structure of Ti/Al/Ti, Mo/Al/Mo, Mo/AlGe/Mo, and Ti/Cu.

The second lower pad 135 may be disposed in the non-display area NDA. The second lower pad 135 may overlap the first lower pad 123 in the thickness direction and may be in direct contact with the first lower pad 123 in line with it in the thickness direction.

Although the second insulating layer 112 is shown as being in contact with the inner surface of the second lower pad 135, this is merely illustrative.

The color filter layers 141, 143, and 145 may be disposed on the second conductive layer.

The color filter layers 141, 143, and 145 may include the first color filter 141 disposed in the first pixel PX1, the second color filter 143 disposed in the second pixel PX2, and the third color filter 145 disposed in the third pixel PX3.

A light may have a wavelength range of red light after it has passed through the first color filter 141; a light may have a wavelength range of green light after it has passed through the second color filter 143; and a light may have a wavelength range of blue light after it has passed through the third color filter 145. However, the colors of the light after passing through the color filters are not limited to the primary colors (red, green, and blue). Each of the color filters may reproduce one of cyan, magenta, yellow, and white colors. The first color filter 141 to the third color filter 145 may be formed of different materials displaying different colors.

According to an exemplary embodiment of the invention, a first column spacer 147 may be disposed on the non-display area NDA. The first column spacer 147 may be disposed on the same layer as the color filter layers 141, 143, and 145. The first column spacer 147 may be made of the same material as the first color filter 141. In some exemplary embodiments, the first column spacer 147 may be made of the same material as the second color filter 143 or the third color filter 145.

The first column spacer 147 may overlap the second lower pad 135 in the thickness direction. The first column spacer 147 may serve to maintain a certain distance between the first substrate 100 and the second substrate 300 together with a second column spacer CS, to be described later.

The third insulating layer 150 may be disposed on the color filters 141, 143, and 145. The third insulating layer 150 may insulate the third conductive layer from the third conductive layer. The third insulating layer 150 may include an organic insulating material. The organic insulating material may include at least one of: polyacrylate resin, epoxy resin, phenolic resin, polyamide resin, polyimide resin, unsaturated polyesters resin, polyphenylene ether resin, polyphenylene sulfide resin, benzocyclobutene (BCB), etc.

The third insulating layer 150 may be disposed in the display area DA and in a portion of the non-display area NDA. The third insulating layer 150 may not overlap with the second lower pad 135 in the thickness direction. The outer surface of the third insulating layer 150 may be aligned with the inner surface of the second lower pad 135 in the thickness direction.

The third conductive layer may be disposed on the third insulating layer 150. The third conductive layer may include a pixel electrode 161 connected to the thin-film transistors of the pixels PX1, PX2, and PX3, and a connection electrode 163 disposed to overlap the sealing member SEAL. The area where the pixel electrode 161 is disposed in the display area DA may be defined as each of the pixels PX1, PX2, and PX3 as described above. The pixel electrode 161 may be electrically connected to the source electrode 131 or the drain electrode 133 of the thin-film transistor.

The third conductive layer may include a transparent conductive material. Examples of the transparent conductive material include indium-tin-oxide (ITO), indium-zinc-oxide (IZO), zinc oxide (ZnO), indium oxide ($In_2O_3$), etc.

The connection electrode 163 may be electrically connected to the first lower pad 123 through a contact hole penetrating through the third insulating layer 150 and the second insulating layer 112.

The lower alignment layer 170 and the second dam DAM2 may be disposed on the third conductive layer. The lower alignment layer 170 may be disposed over each of the pixels PX1, PX2, and PX3, and the non-exiting area PB positioned around the pixels PX1, PX2, and PX3. The lower alignment layer 170 may induce the initial alignment of the liquid crystal molecules in the liquid crystal layer 200. For example, the lower alignment layer 170 may include a polymer organic material having an imide group in a repeating unit of the main chain.

The lower alignment layer 170 may completely cover the pixel electrode 161 and may be partially extended outwardly.

The second dam DAM2 can serve to prevent the material of the lower alignment layer 170 from flowing down to the non-display area NDA. The second dam DAM2 may be in contact with a side surface of the lower alignment layer 170.

The second dam DAM2 may be disposed directly on the upper surface of the third insulating layer 150, but the inventive concepts are not limited thereto.

The first substrate 100 may further include a bottom polarization layer BPOL disposed under the first base substrate 101.

The second substrate 300 may include a second base substrate 301, a light-blocking pattern 310 disposed on the second base substrate 301, a fourth conductive layer disposed on the light-blocking pattern 310, and an upper alignment layer 330 and a first dam DAM1 may be disposed on the fourth conductive layer.

The second base substrate 301 may face the first base substrate 101. The second base substrate 301 may be made of transparent glass, plastic, etc., and in an exemplary embodiment may be made of the same material as the first base substrate 101.

The light-blocking pattern 310 may be disposed on the second base substrate 301. The light-blocking pattern 310 may be disposed on the second base substrate 301. The light-blocking pattern 310 may be disposed so that it overlaps the non-exiting area PB and the non-display area NDA. The light-blocking pattern 310 may overlap with a portion of each of the pixels PX1, PX2, and PX3.

The light-blocking pattern 310 can block the light from traveling toward the non-exiting area PB and the non-display area NDA. The material of the light-blocking pattern 310 is not particularly limited as long as it can block light. According to an exemplary embodiment of the invention, the light-blocking pattern 310 may be made of a photosensitive composition, an organic material, or a metallic material. According to an exemplary embodiment of the invention, the photosensitive composition may include a binder resin, a polymerizable monomer, a polymerizable oligomer, a pigment, a dispersant, and the like. The metallic material may include chromium or the like.

The third conductive layer may include a common electrode 320 disposed in the display area DA, and an upper pad 340 disposed in the non-display area NDA.

At least a part of the common electrode 320 may overlap with the pixel electrode 161 in each of the pixels PX1, PX2, and PX3. The common electrode 320 may have a shape of a single continuous plate, for example. It is, however, to be understood that the inventive concepts are not limited thereto. The common electrode 320 may include a plurality of slits. In an exemplary embodiment, the common electrode 320 may be made of a transparent conductive material, such as ITO and IZO, or a reflective metal, such as aluminum, silver, chrome, or an alloy thereof.

The upper pad 340 may be disposed in the non-display area NDA. The upper pad 340 may be disposed on the same layer as the common electrode 320 and may be made of the same material as the common electrode 320. The upper pad 340 may overlap the sealing member SEAL and the first column spacer CS.

The upper alignment layer 330 and the first dam DAM1 may be disposed on the fourth conductive layer. The upper alignment layer 330 may induce the initial alignment of the liquid crystal molecules in the liquid crystal layer 200. The upper alignment layer 330 may be made of the same material as the lower alignment layer 170, for example. The upper alignment layer 330 may be disposed over each of the pixels PX1, PX2, and PX3, and the non-exiting area PB positioned around the pixels PX1, PX2, and PX3.

The upper alignment layer 330 may cover a part of the common electrode 320.

The first dam DAM1 can serve to prevent the material of the upper alignment layer 330 from flowing down to the non-display area NDA. The first dam DAM1 may be in contact with a side surface of the upper alignment layer 330.

The first dam DAM1 may be disposed directly on the lower surface of the common electrode 320, but the inventive concepts are not limited thereto.

The second substrate 300 may further include a top polarization layer UPOL disposed on the second base substrate 301.

The top polarization layer UPOL and the bottom polarization layer BPOL may be disposed over the display area DA and the non-display area NDA, but the inventive concepts are not limited thereto.

The liquid crystal layer 200 may be disposed between the first substrate 100 and the second substrate 300. The liquid crystal layer 200 may be disposed in the display area DA.

The sealing member SEAL may be disposed between the first substrate 100 and the second substrate 300. The sealing member SEAL may be disposed on the non-display area NDA and on the outer side of the liquid crystal layer 200.

The sealing member SEAL may overlap the common electrode 320 and the upper pad 340 to be in direct contact with them, and may be in direct contact with the light-blocking pattern 310 at the spacing between the common electrode 320 and the upper pad 340. In addition, the sealing member SEAL may overlap and in contact with the third insulating layer 150 and the connection electrode 163.

The sealing member SEAL can prevent the liquid crystal layer 200 from flowing down to the non-display area NDA.

As shown in FIG. 4, the sealing member SEAL may include a resin layer RL and conductive balls CB dispersed in the resin layer RL. There may be a plurality of conductive balls CB.

The conductive balls CB may serve to electrically connect the upper pad 340 with the connection electrode 163.

The second column spacer CS may be further disposed in the non-display area NDA on the outer side of the sealing member SEAL. The second column spacer CS may overlap the first column spacer 147 in the thickness direction and may be in direct contact with it.

The outer surfaces of the first lower pad 123, the second lower pad 135, and the upper pad 340 may be aligned with one another in the thickness direction, and the outer surfaces may be located more to the outside than the outer surface of the column spacers CS and 147. In other words, the outer surfaces of the column spacers CS and 147 may be located more to the inside than the outer surfaces of the first lower pad 123, the second lower pad 135 and the upper pad 340. The outer surfaces of the column spacers CS and 147 may be aligned with one another in the thickness direction.

According to an exemplary embodiment of the invention, the display panel may further include a side pad SDAD disposed on the side surface of one end of each of the first substrate 100 and the second substrate 300. There may be a plurality of side pads SDAD. The side pads SDAD may be spaced apart from each other in the first direction DR1 in FIG. 1. The side pads SDAD may be electrically connected to the lower pads 123 and 135 and the upper pads 340, respectively.

That is to say, the side pads SDAD may be in direct contact with the outer surfaces of the lower pads 123 and 135 and the outer surfaces of the upper pads 340, as well as outer surfaces of other insulating layers of the first substrate 100 and other elements of the second substrate 300. Moreover, the side pads SDAD may be in direct contact with the outer surfaces of the column spacers CS and 147.

The side pads SDAD may include a conductive material. Examples of the conductive material may include, but are not limited to, silver (Ag), copper (Cu), gold (Au).

The printed circuit board 400 may be disposed on the side pads SDAD. The printed circuit board 400 may include a plurality of lead lines. The lead lines may be spaced apart from one another in the first direction DR1 of FIG. 1. Each of the lead lines may be coupled with another one in the second direction DR2 via a coupling member AM between itself and the respective side pad SDAD. The coupling member AM may include an anisotropic conductive film ACF. That is to say, the side pads PAD may be electrically connected to the lead lines through the anisotropic conductive film ACF.

It can be seen from FIG. 5 that, in the region where the lower pads 123 and 135 and the upper pads 340 are not disposed, the outer surfaces of the column spacers CS and 147 may be aligned with the side surfaces of the other elements of the first substrate 100 and the second substrate 300.

Figure 6:
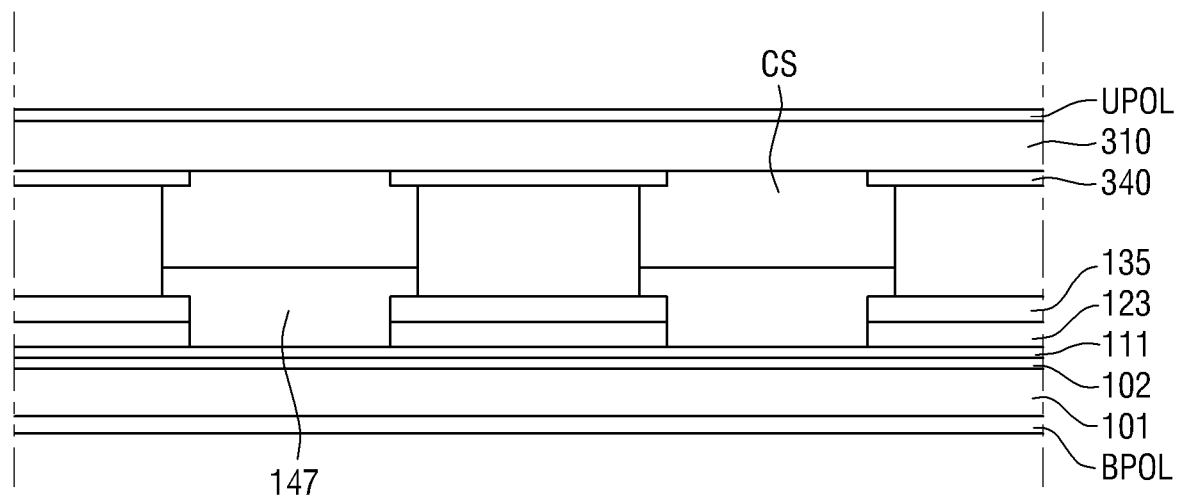
FIG. 6 is a cross-sectional view with respect to an end of the display panel of FIG. 4.
Figure 7:
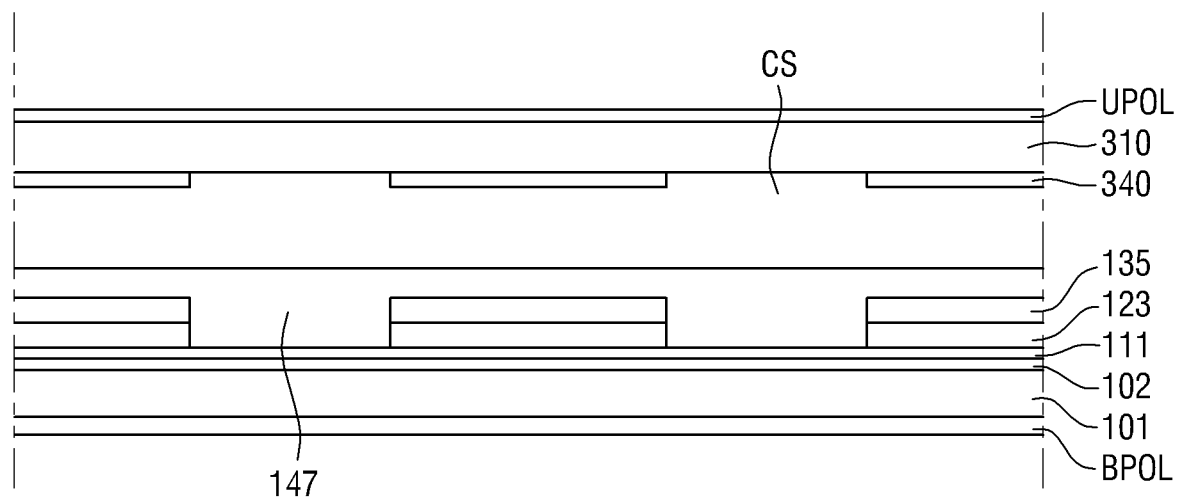
FIG. 7 is another cross-sectional view of the display panel of FIG. 4.

FIG. 6 is a cross-sectional view with respect to an end of the display panel of FIG. 4. FIG. 7 is another cross-sectional view oSDAD of the display panel is not depicted for convenience of illustration. In addition, the cross-sectional view of FIG. 6 shows the first substrate 100 and the end of the second substrate 300 described above with respect to the second direction DR2 (the region where the lower pads 123 and 135 and the upper pads 340 are disposed but the column spacer CS and 147 are not disposed). The cross-sectional view of FIG. 7 shows the first substrate 100 and the end of the second substrate 300 described above with respect to the second direction DR2 (the region where the lower pads 123 and 135 and the upper pads 340 are disposed along with the column spacer CS and 147).

Referring to FIG. 6, the first lower pads 123 may be spaced apart from one another in the first direction DR1, and the second lower pads 135 may be spaced apart from one another in the first direction DR1. The first lower pads 123 may overlap the second lower pads 135 in the thickness direction, respectively. The first column spacer 147 may be disposed between the adjacent first lower pads 123. The first column spacer 147 may be in contact with the side surfaces of the lower pads 123 and 135.

The upper pads 340 may also be spaced apart from one another in the first direction DR1. The upper pads 340 may overlap with the lower pads 123 and 135 in the thickness direction.

The second column spacer CS may be disposed between the adjacent upper pads 340. The second column spacer CS may be in contact with the side surfaces of the upper pads 340.

Referring to FIG. 7, the first column spacer 147 may overlap the lower pads 123 and 135. That is to say, the first column spacer 147 may be in contact with the upper surface of the second lower pads 135. The second column spacer CS may overlap the upper pads 340. That is to say, the second column spacer CS may be in contact with the lower surfaces of the upper pads 340.

Figure 8:
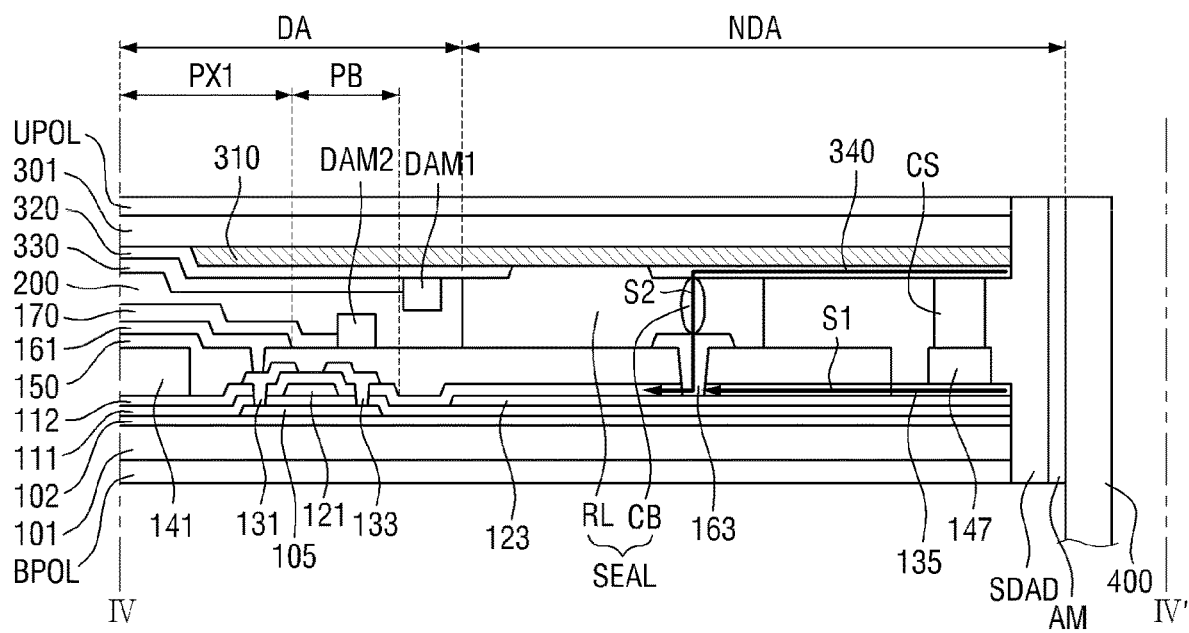
FIG. 8 is a cross-sectional view for illustrating that a first signal and a second signal are applied through a printed circuit board.

FIG. 8 is a cross-sectional view for illustrating that a first signal and a second signal are applied through a printed circuit board.

Referring to FIG. 8, a first signal S1 and a second signal S2 may be applied from the printed circuit board 400 to the display panel through the lower pads 123 and 135 and the upper pad 340, respectively. Specifically, the second signal S2 may be applied from the printed circuit board 400 to the first lower pad 123 through the side pad SDAD, the upper pad 340, the sealing member SEAL, and the connection electrode 163. The second signal S2 may be applied from the printed circuit board 400 to the first lower pad 123 through the side pad SDAD. More specifically, the sealing member SEAL includes a conductive ball CB as described above. The upper pad 340 and the connection electrode 163 may be electrically connected to each other through the conductive ball CB. The first signal S1 may be identical to the second signal S2 except that they are applied to the display panel through different paths. For example, each of the first signal S1 and the second signal S2 may be a data voltage, a gate signal, or a supply voltage applied to a single first lower pad 123.

The second signal S2 may be applied to the first lower pad 123 via the second lower pad 135, for example.

In the display device 1 according to the exemplary embodiment of the invention, the side pad SDAD electrically connected to the printed circuit board 400 is in physical contact with the upper pad 340 of the second substrate 300 and with the lower pads 123 and 135 of the first substrate 100, so that the contact area can be increased. Even if the contact area is increased, the overall resistance can be actually reduced only if the upper pad 340 and the first lower pad 123 are electrically connected with each other. Accordingly, as described above, the side pad SDAD can be electrically connected to the upper pad 340 and the lower pads 123 and 135. Specifically, signals are applied to one first lower pad 123 through the path of the first signal S1 and the path of the second signal S2 from the printed circuit board 400, so that the signals S1 and S2 applied to the side pad SDAD are applied to each of the pixels PX1, PX2, and PX3 of the display panel through the two paths in parallel, thereby reducing the overall resistance. In this manner, it is possible to prevent line defects.

Hereinafter, display devices according to other exemplary embodiments of the invention will be described. In the following description, the same or similar elements will be denoted by the same or similar reference numerals, and redundant descriptions will be omitted or briefly described.

Figure 9:
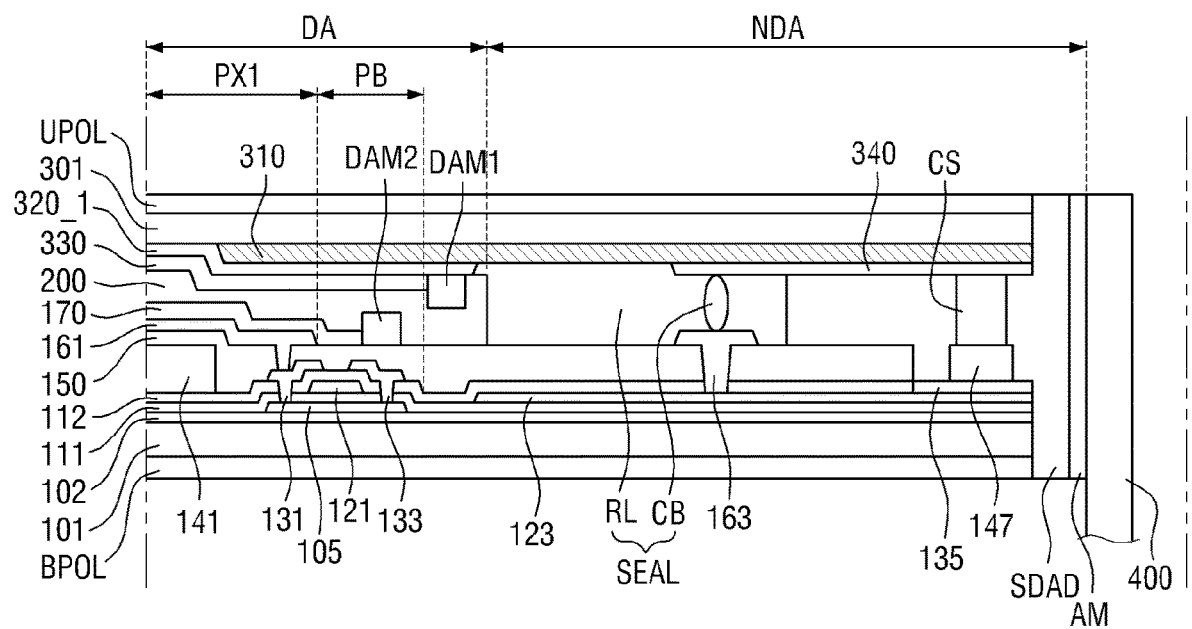
FIG. 9 is a cross-sectional view of a display device according to another exemplary embodiment of the invention.

FIG. 9 is a cross-sectional view of a display device according to another exemplary embodiment of the invention.

The display device according to the exemplary embodiment shown in FIG. 9 is different from the display device shown in FIG. 4 in that a common electrode 320_1 does not overlap with the sealing member SEAL.

The other elements are identical to those described above with reference to FIG. 4; and, therefore, the redundant description will be omitted.

Figure 10:
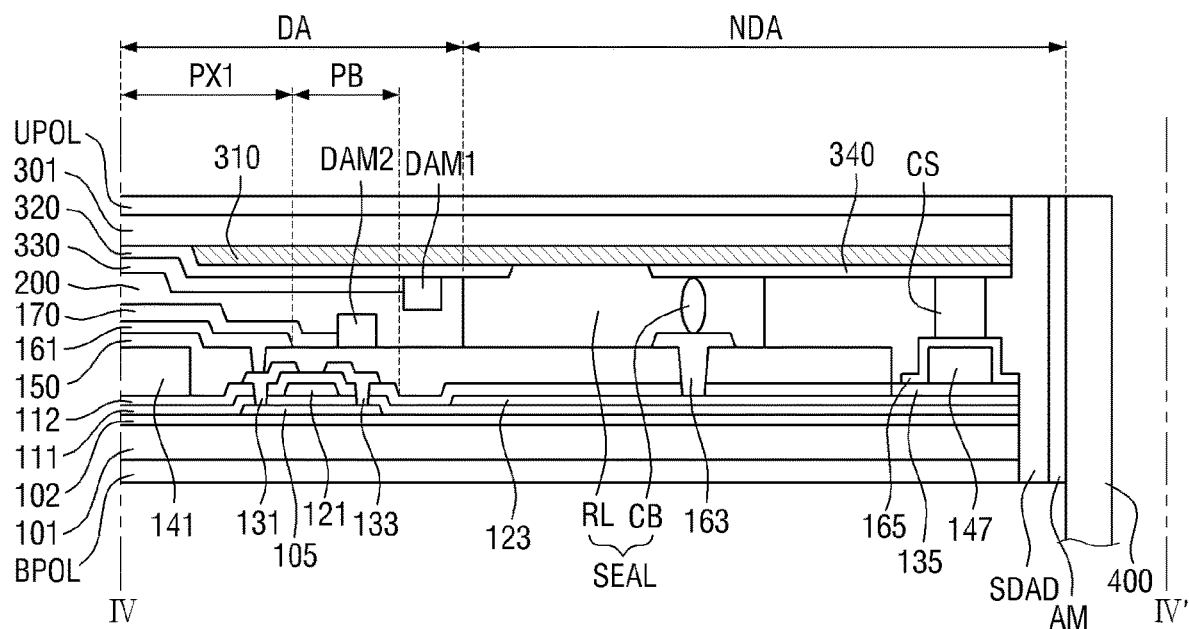
FIG. 10 is a cross-sectional view of a display device according to yet another exemplary embodiment of the invention.
Figure 11:
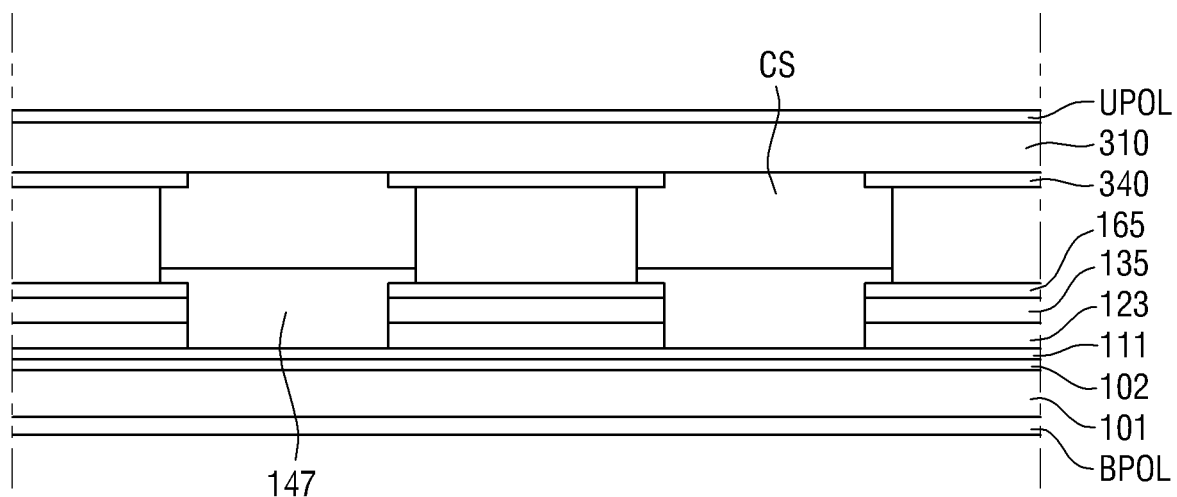
FIG. 11 is a cross-sectional view with respect to an end of the display panel of FIG. 10.
Figure 12:
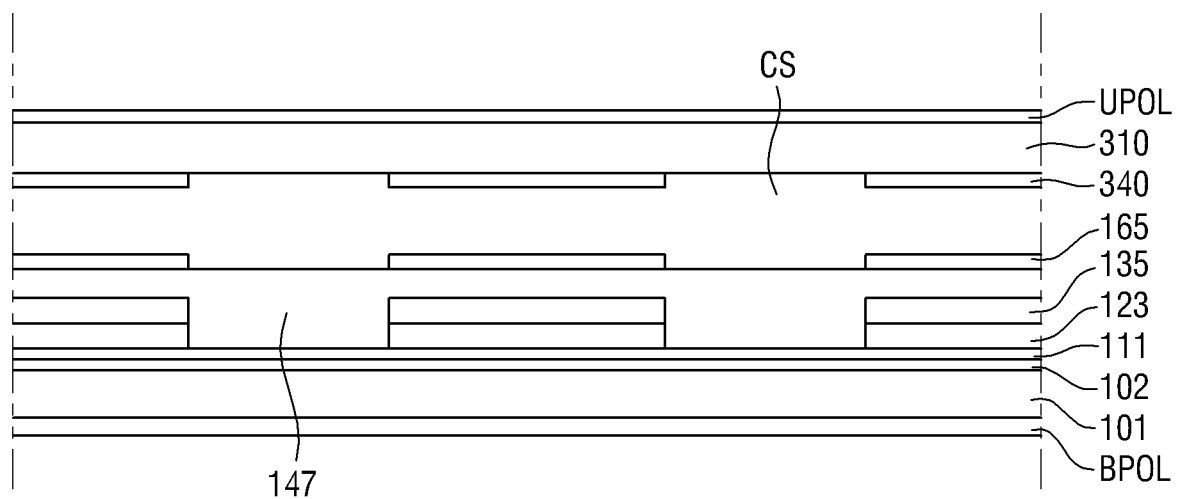
FIG. 12 is another cross-sectional view of the display panel of FIG. 10.

FIG. 10 is a cross-sectional view of a display device according to yet another exemplary embodiment of the invention. FIG. 11 is a cross-sectional view with respect to an end of the display panel of FIG. 10. FIG. 12 is another cross-sectional view of the display panel of FIG. 10.

The display device according to the exemplary embodiment shown in FIGS. 10 to 12 is different from the display device shown in FIGS. 4, 6 and 7 in that the third conductive layer further includes a third lower pad 165 interposed between the first column spacer 147 and the second column spacer CS.

More specifically, the third conductive layer may further include the third lower pad 165 disposed between the first column spacer 147 and the second column spacer CS.

The third lower pad 165 may cover the upper surface and side surfaces of the first column spacer 147 and may be in contact with the upper surface of the second lower pad 135 disposed thereunder. The outer surface of the third lower pad 165 may be aligned with the outer surfaces of the lower pads 123 and 135 disposed thereunder in the thickness direction. The side pad SDAD may be in direct contact with the outer surfaces of the lower pads 123, 135, and 165.

According to this exemplary embodiment of the invention, the display device further includes the third lower pads 165 disposed on the third conductive layer, so that the contact area with the side pad SDAD can be increased. As a result, the contact resistance between the side pad SDAD and the lower pads 123, 135, and 165 can be reduced.

In addition, the third lower pad 165 further covers the upper surface of the second lower pad 135 partially exposed by the first column spacer 147, thereby preventing corrosion of the exposed second lower pad 135.

Referring to FIG. 11, the third lower pad 165 may be in direct contact with the adjacent first column spacer 147.

Referring to FIG. 12, the third lower pad 165 may be disposed on the first column spacer 147 and disposed between the first column spacer 147 and the second column spacer CS.

Figure 13:
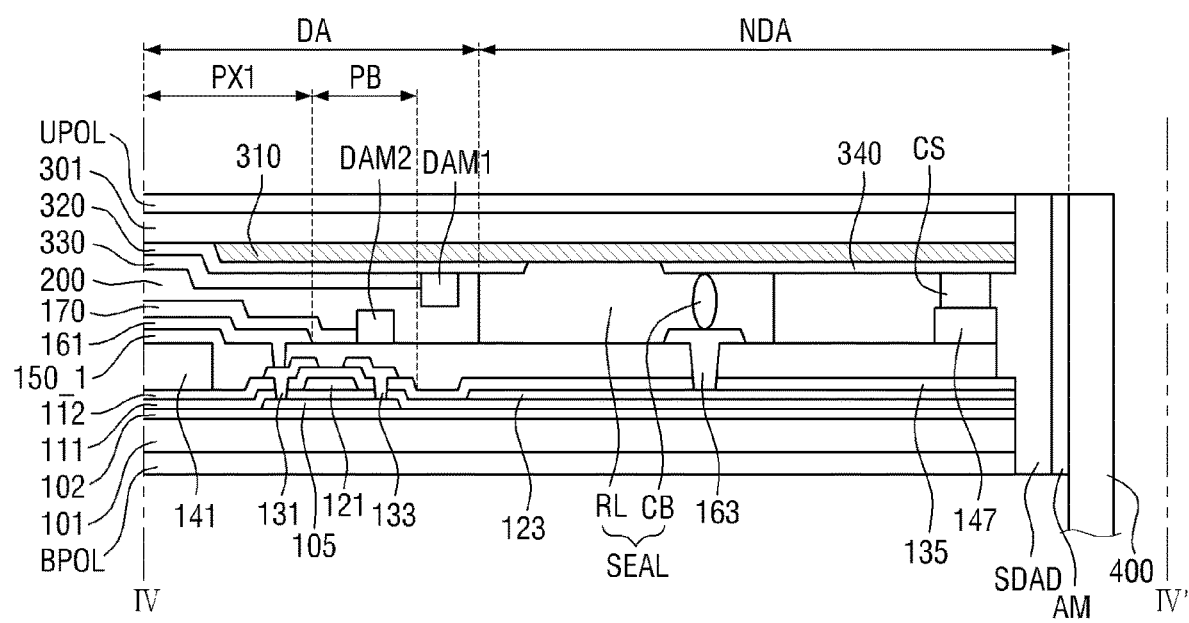
FIG. 13 is a cross-sectional view of a display device according to yet another exemplary embodiment of the invention.
Figure 14:
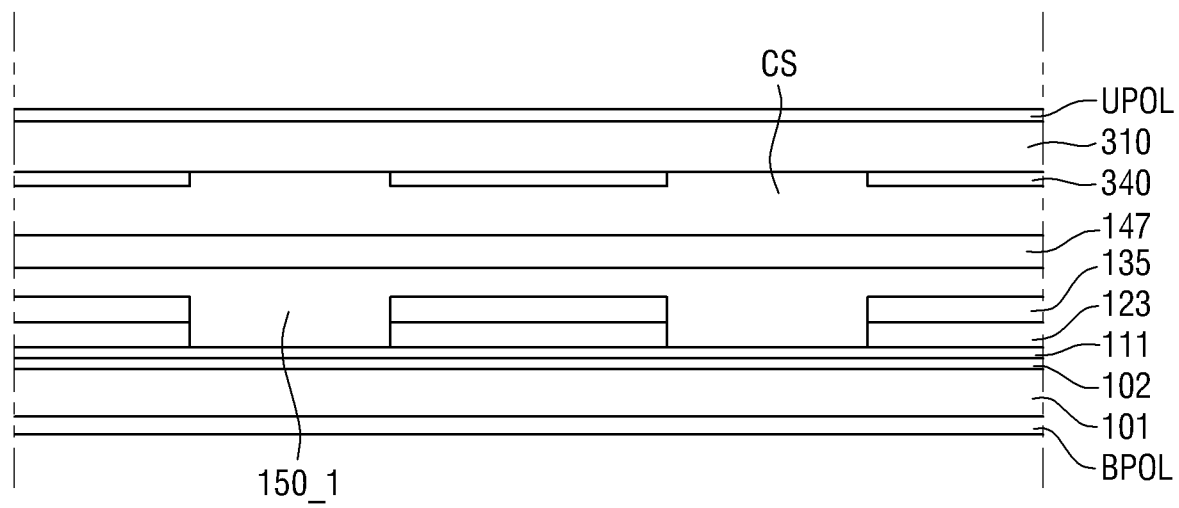
FIG. 14 is a cross-sectional view of the display panel of FIG. 13.

FIG. 13 is a cross-sectional view of a display device according to yet another exemplary embodiment of the invention. FIG. 14 is a cross-sectional view of the display panel of FIG. 13.

Referring to FIGS. 13 and 14, in the display device according to this exemplary embodiment, a third insulating layer 150_1 may be further extended toward one end of the non-display area NDA. More specifically, the third insulating layer 150_1 may overlap the first column spacer 147 in the thickness direction. As the third insulating layer 150_1 is further extended toward the end of the non-display area NDA, it is possible to prevent corrosion of the exposed second lower pad 135.

Referring to FIG. 14, the second insulating layer 150_1 may cover side surfaces and upper surfaces of adjacent lower pads 123 and 135. The first column spacer 147 may be disposed on the second insulating layer 150_1.

Figure 15:
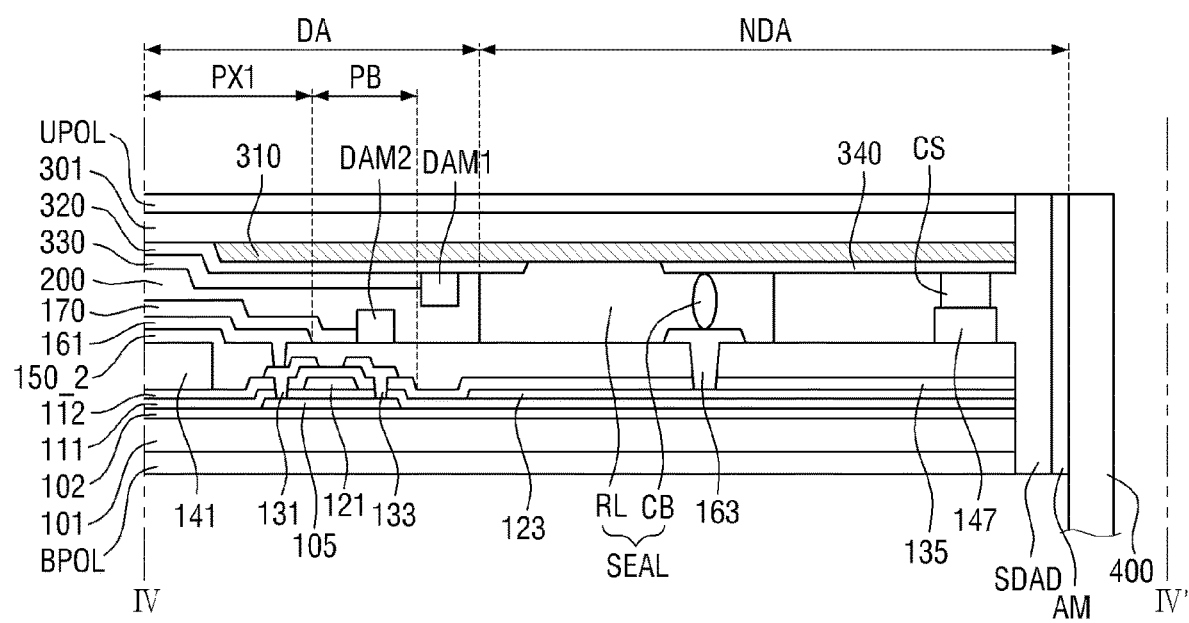
FIG. 15 is a cross-sectional view of a display device according to yet another exemplary embodiment of the invention.
Figure 16:
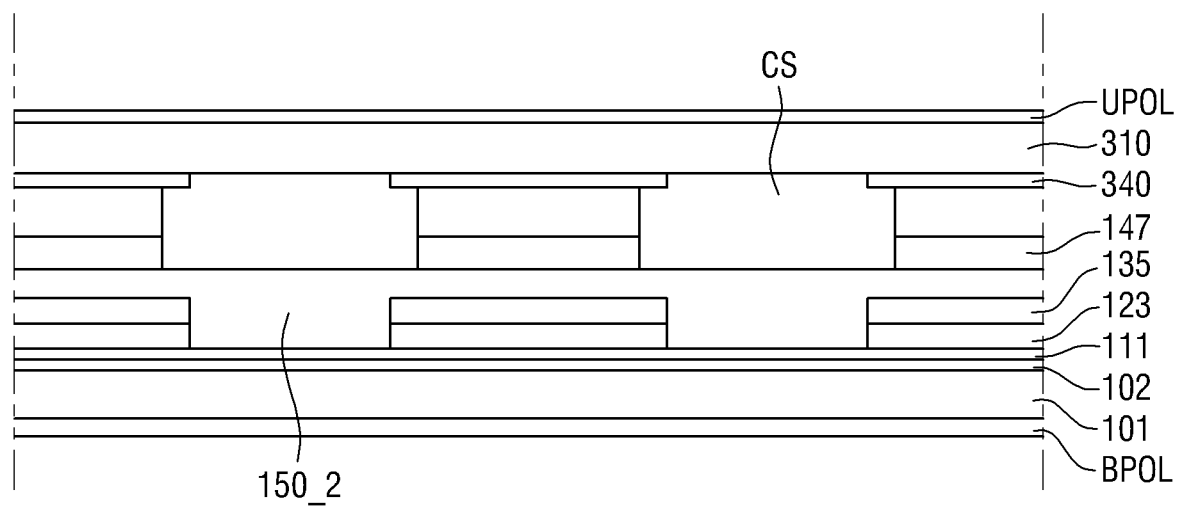
FIG. 16 is a cross-sectional view with respect to an end of the display panel of FIG. 15.
Figure 17:
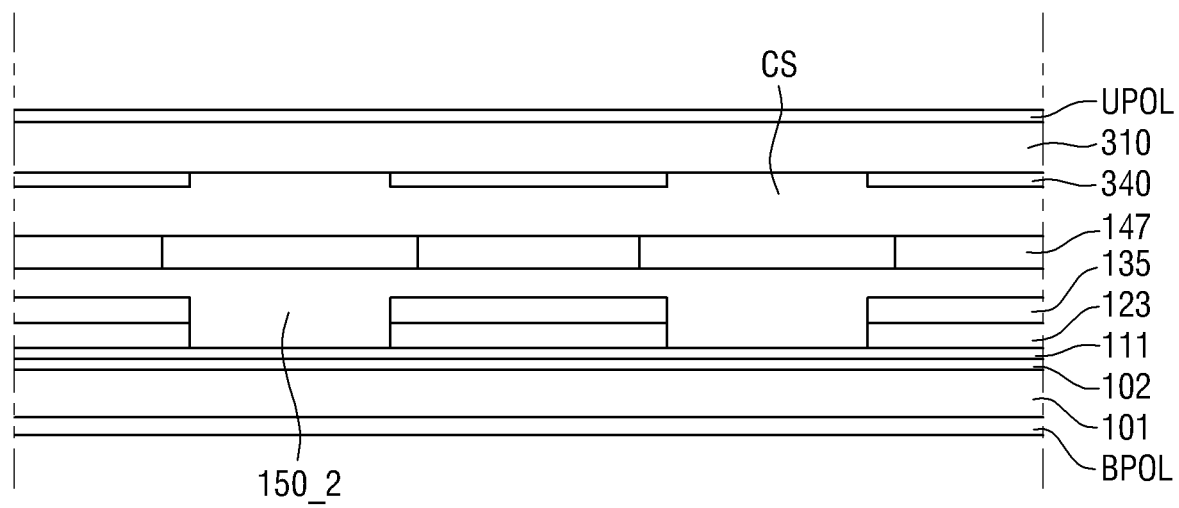
FIG. 17 is another cross-sectional view of the display panel of FIG. 15.

FIG. 15 is a cross-sectional view of a display device according to yet another exemplary embodiment of the invention. FIG. 16 is a cross-sectional view with respect to an end of the display panel of FIG. 15. FIG. 17 is another cross-sectional view of the display panel of FIG. 15.

The display device according to the exemplary embodiment shown in FIGS. 15 to 17 is different from the display device according to the exemplary embodiment of FIG. 13 in that a third insulating layer 150_2 is fully extended to one end of the non-display area NDA.

More specifically, the outer surface of the third insulating layer 150_2 may be aligned with the outer surfaces of the lower pads 123 and 135 and the outer surface of the upper pad 340 in the thickness direction. The outer surface of the third insulating layer 150_2 may be in contact with the side pad S_PAD.

Referring to FIGS. 16 and 17, the third insulating layer 150_2 may be in contact with side surfaces and upper surface of the lower pads 123 and 135. The first column spacer 147 may be disposed on the third insulating layer 150_2.

Figure 18:
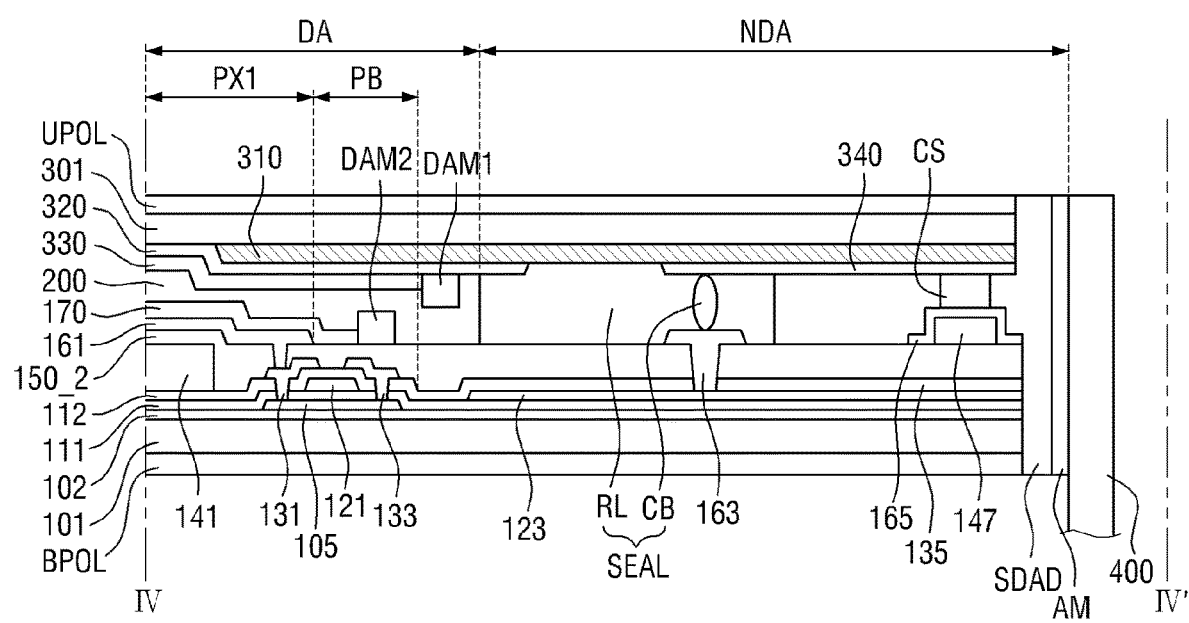
FIG. 18 is a cross-sectional view of a display device according to yet another exemplary embodiment of the invention.
Figure 19:
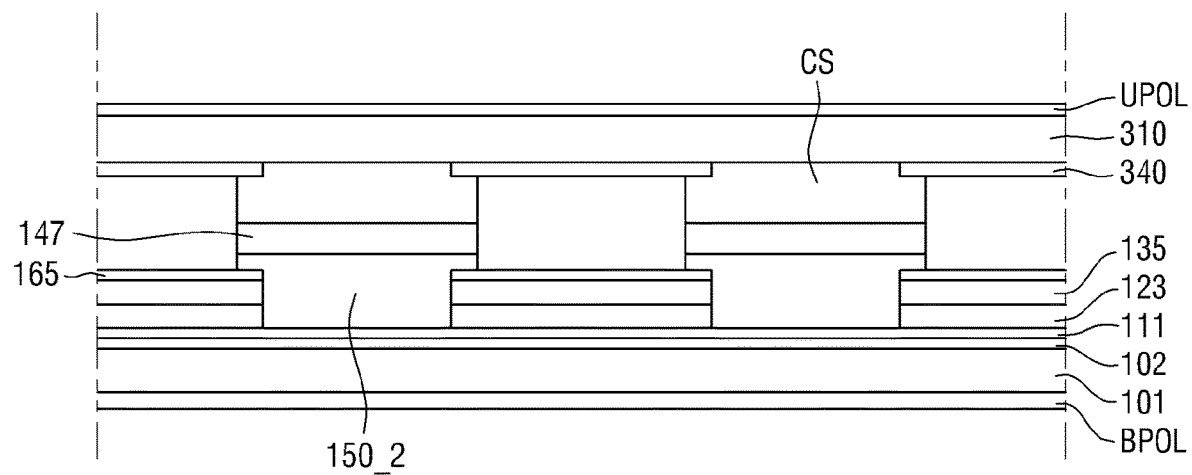
FIG. 19 is a cross-sectional view with respect to an end of the display panel of FIG. 18.
Figure 20:
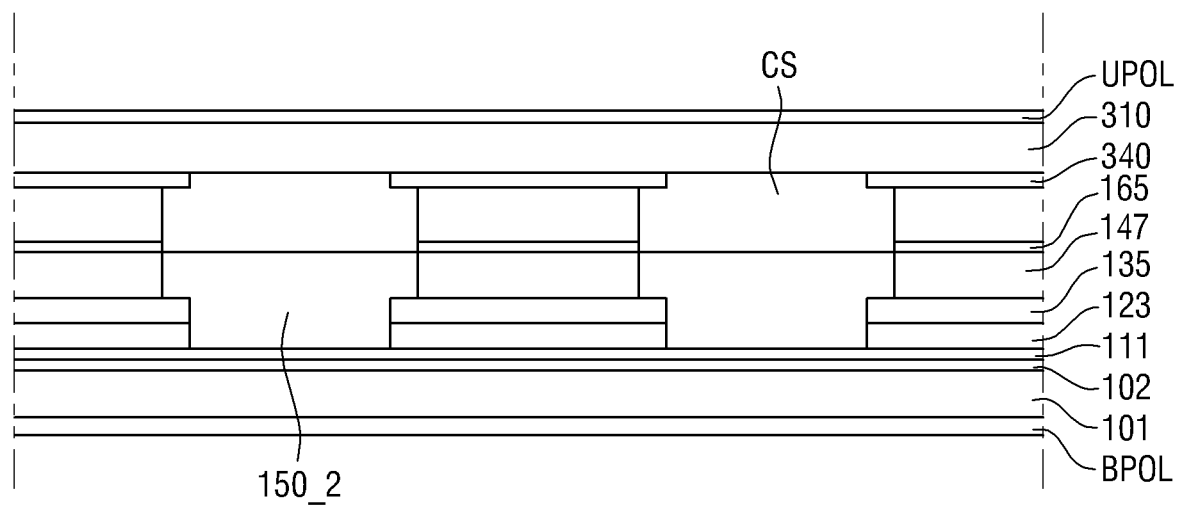
FIG. 20 is another cross-sectional view of the display panel of FIG. 18.

FIG. 18 is a cross-sectional view of a display device according to yet another exemplary embodiment of the invention. FIG. 19 is a cross-sectional view with respect to an end of the display panel of FIG. 18. FIG. 20 is another cross-sectional view of the display panel of FIG. 18.

The display device according to the exemplary embodiment shown in FIGS. 18 to 20 is different from the display device shown in FIGS. 15 to 17 in that a fourth conductive layer further includes a third lower pad 165 overlapping with the first column spacer 147.

More specifically, the third lower pad 165 may be disposed between the first column spacer 147 and the second column spacer CS like the exemplary embodiment of FIG. 10. The third lower pad 165 may be in directly contact with the upper surface of the insulating layer 150_2.

Referring to FIG. 19, the third lower pad 165 may be disposed between the upper pad 340 and the lower pads 123 and 135.

Referring to FIG. 20, the third lower pad 165 may be disposed between the first column spacer 147 and the second column spacer CS.

Figure 21:
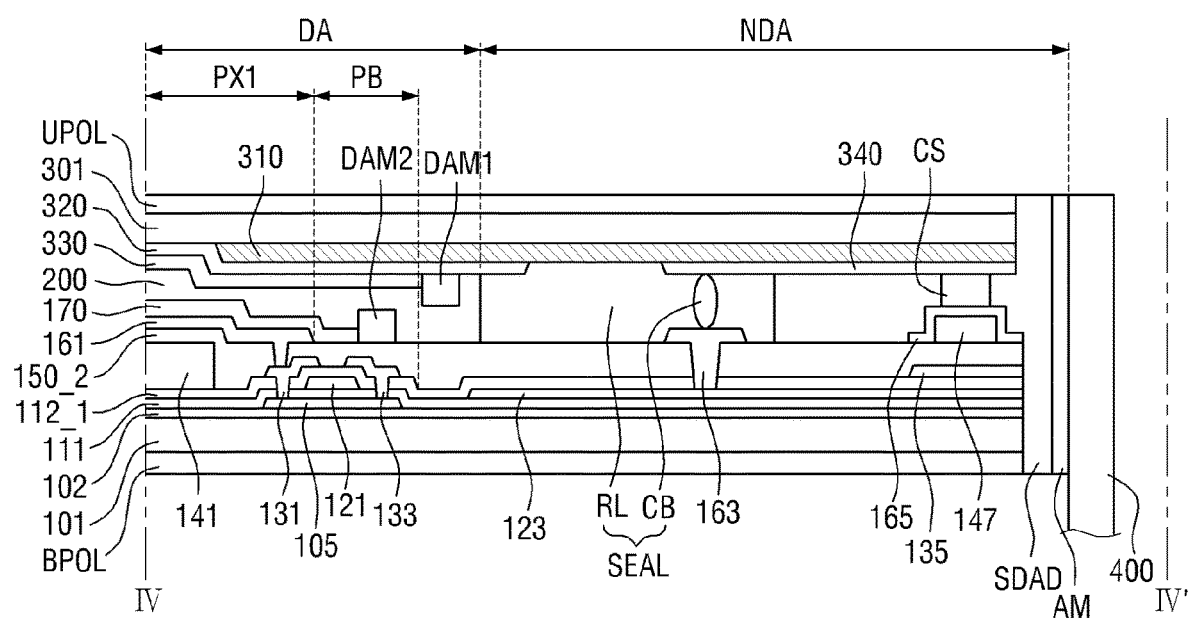
FIG. 21 is a cross-sectional view of a display device according to yet another exemplary embodiment of the invention.

FIG. 21 is a cross-sectional view of a display device according to yet another exemplary embodiment of the invention.

The display device according to the exemplary embodiment shown in FIG. 21 is different from the display device according to the exemplary embodiment of FIG. 18 in that a second insulating layer 112_1 is fully extended toward one end of the non-display area NDA.

The second insulating layer 112_1 may be disposed between the second lower pad 135 and the first lower pad 123.

Figure 22:
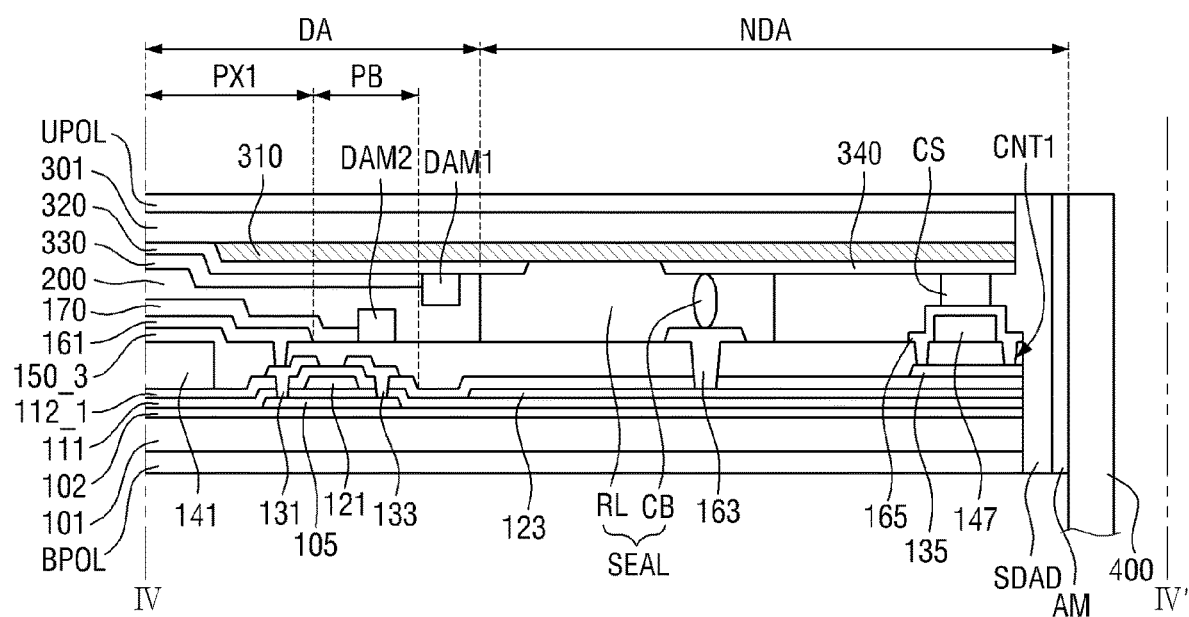
FIG. 22 is a cross-sectional view of a display device according to yet another exemplary embodiment of the invention.

FIG. 22 is a cross-sectional view of a display device according to yet another exemplary embodiment of the invention.

The display device according to the exemplary embodiment shown in FIG. 22 is different from the display device of FIG. 21 in that a third insulating layer 150_3 includes first contact holes CNT1 and third lower pads 165 are connected to second lower pads 135 through the first contact holes CNT1.

The other elements are identical to those described above with reference to FIGS. 21 and 18. Therefore, the redundant description will be omitted FIG. 23 is a cross-sectional view of a display device according to yet another exemplary embodiment of the invention.

Figure 23:
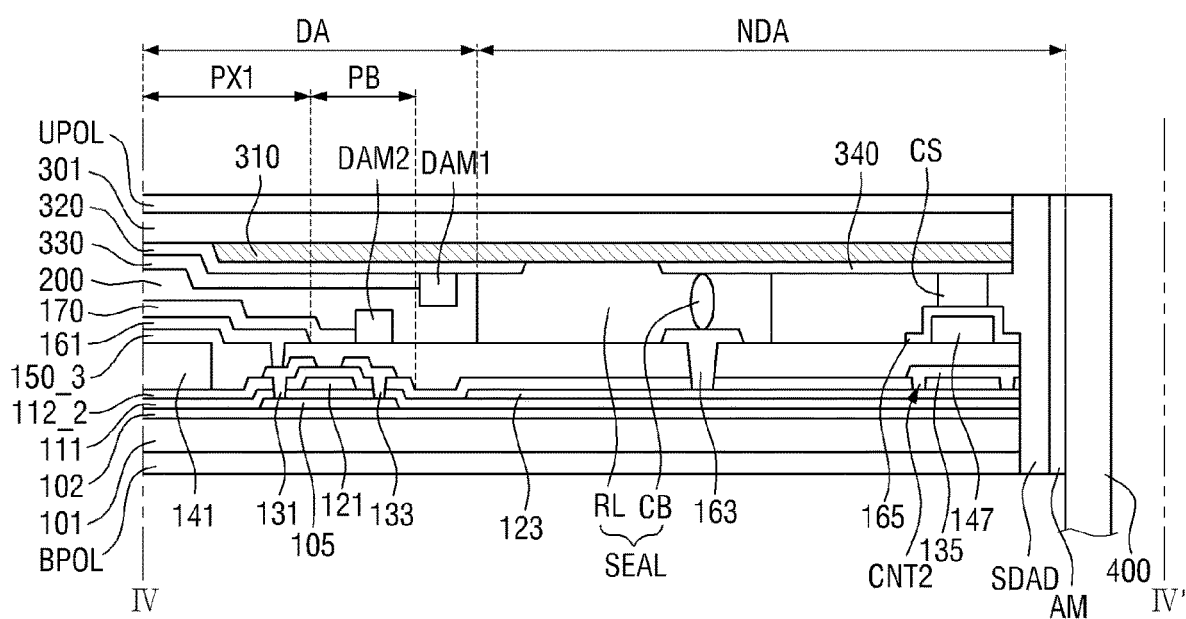
FIG. 23 is a cross-sectional view of a display device according to yet another exemplary embodiment of the invention.

The display device according to the exemplary embodiment shown in FIG. 23 is different from the display device of FIG. 21 in that a second insulating layer 112_2 includes a second contact hole CNT2 and a second lower pad 135 is connected to a first lower pad 123 through the second contact hole CNT2.

The other elements are identical to those described above; and, therefore, the redundant description will be omitted.

Figure 24:
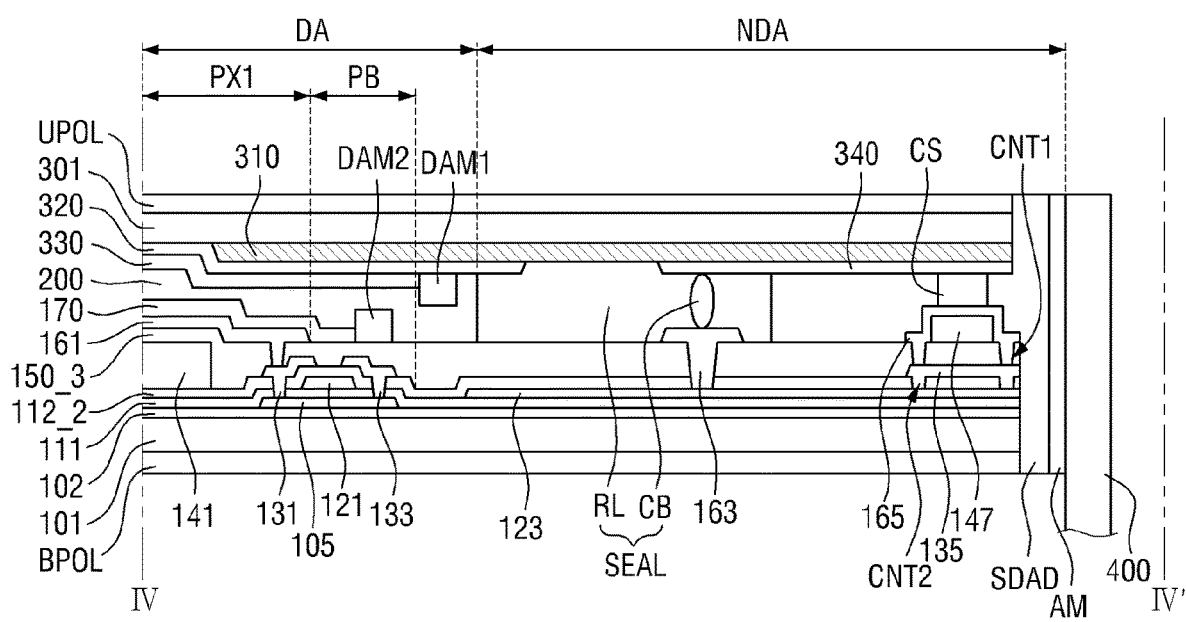
FIG. 24 is a cross-sectional view of a display device according to yet another exemplary embodiment of the invention.

FIG. 24 is a cross-sectional view of a display device according to yet another exemplary embodiment of the invention.

The display device according to the exemplary embodiment shown in FIG. 24 is different from the display device according to the exemplary embodiment of FIG. 22 in that a second insulating layer 112_2 includes the second contact hole CNT2 of FIG. 23.

The other elements are identical to those described above; and, therefore, the redundant description will be omitted.

Figure 25:
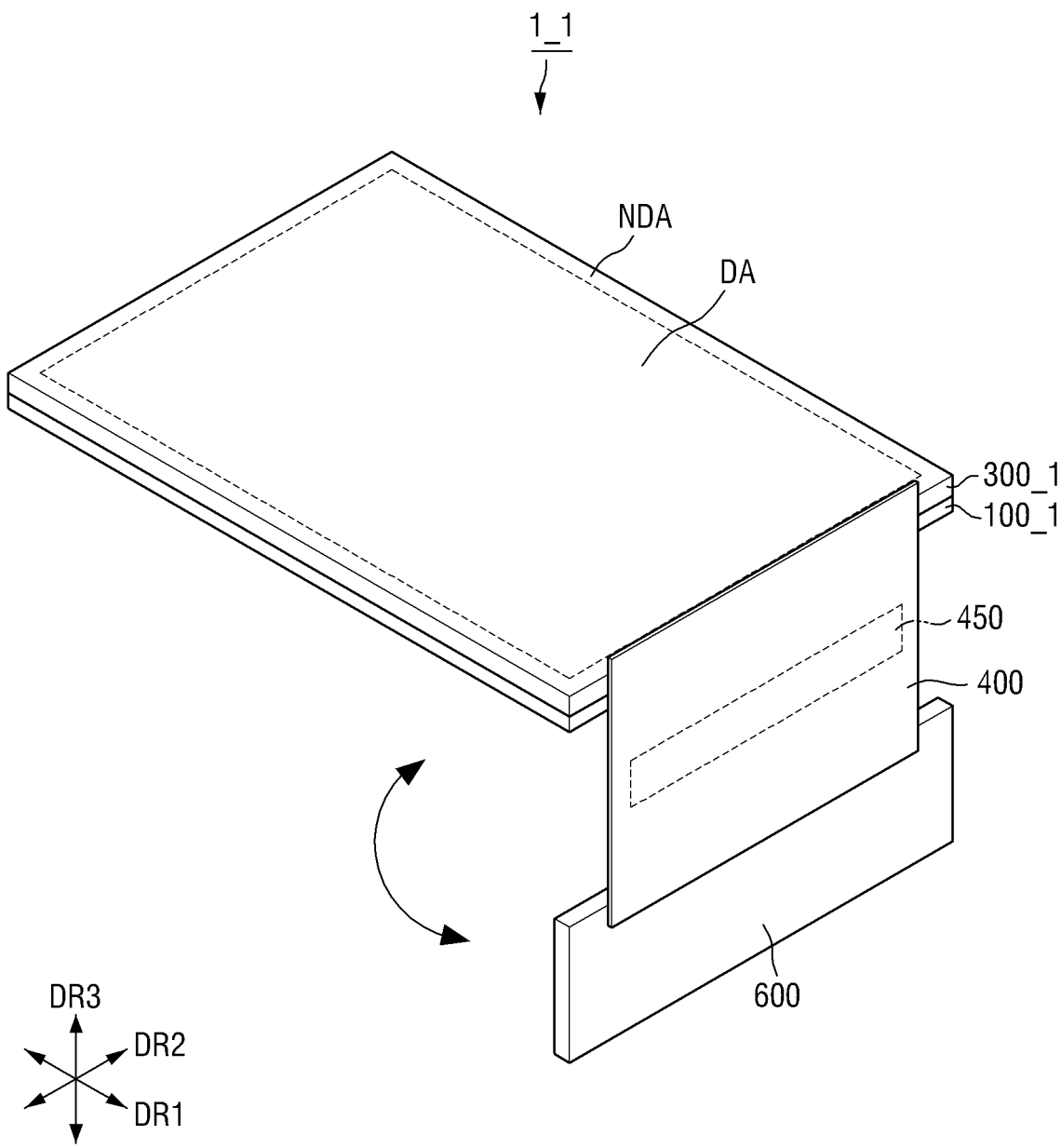
FIG. 25 is a perspective view of a display device according to yet another exemplary embodiment of the invention.

FIG. 25 is a perspective view of a display device according to yet another exemplary embodiment of the invention.

The display device according to the exemplary embodiment shown in FIG. 25 is different from the exemplary embodiment of FIG. 1 in that an organic light-emitting display device is employed as the display device.

More specifically, the organic light-emitting display device may include a first substrate 100_1 and a second substrate 300_1 disposed on the first substrate 100_1. In addition, one printed circuit board 400 may be disposed on the side surface of one end (shorter side) of each of the first substrate 100_1 and the second substrate 300_1.

Unlike the display device 1 according to the exemplary embodiment, the organic light-emitting display device includes neither a backlight unit BLU nor a liquid crystal layer 200.

Unlike the first substrate 100, the first substrate 100_1 does not include the color filter layers 141, 143, and 145, the lower alignment layer 170 and the second dam DAM2 but may include the common electrode 320. That is to say, an organic light-emitting layer may be further disposed between the common electrode 320 opposed to the pixel electrode 161 and the pixel electrode 161.

Unlike the second substrate 300, the second substrate 300_1 may not include the common electrode 320, the upper alignment layer 330, and the first dam DAM1. The second substrate 300_1 may be an encapsulation substrate for encapsulating the organic light-emitting layer of the first substrate 100_1.

The inventive concepts provide a display device in which it is possible to reduce the contact resistance between a pad of a display panel and a lead of a printed circuit board disposed on a side of the display panel.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a first substrate comprising a first base substrate and a lower pad disposed on one end of the first base substrate on a side;
a second substrate disposed above the first substrate and comprising a second base substrate and an upper pad disposed on an end of the second base substrate on the side;
a side pad electrically connected to the lower pad and the upper pad; and
a sealing member disposed between the first substrate and the second substrate,
wherein:
the sealing member comprises an insulating resin and conductive balls dispersed in the insulating resin;
the upper pad and the lower pad are electrically connected to each other through the conductive balls;
the lower pad includes an upper surface facing the second substrate;
the upper pad includes a lower surface facing the first substrate; and
the side pad directly contacts the upper surface of the lower pad and the lower surface of the upper pad.

2. The display device of claim 1, wherein:
the first substrate comprises a display area and a non-display area positioned around the display; and
the lower pad and the upper pad are disposed in the non-display area.

3. A display device comprising:
a first substrate comprising a first base substrate and a lower pad disposed on one end of the first base substrate on a side;
a second substrate disposed above the first substrate and comprising a second base substrate and an upper pad disposed on an end of the second base substrate on the side;
a side pad electrically connected to the lower pad and the upper pad; and
a sealing member disposed between the first substrate and the second substrate,
wherein:
the sealing member comprises an insulating resin and conductive balls dispersed in the insulating resin;
the upper pad and the lower pad are electrically connected to each other through the conductive balls;
the first substrate comprises:
a display area and a non-display area positioned around the display area;
a first conductive layer disposed on the first base substrate and comprising a gate electrode of a thin-film transistor; and
a second conductive layer disposed on the first conductive layer and comprising a source electrode and a drain electrode of the thin-film transistor;
the lower pad and the upper pad are disposed in the non-display area;
the lower pad comprises a first lower pad and a second lower pad disposed on the first lower pad; and
the first conductive layer comprises the first lower pad and the second conductive layer comprises the second lower pad.

4. The display device of claim 3, wherein outer surfaces of the first lower pad, the second lower pad, and the upper pad are aligned with one another in a thickness direction.

5. The display device of claim 4, wherein:
the first substrate further comprises:
a first insulating layer disposed between the first conductive layer and the second conductive layer;
a second insulating layer disposed on the second conductive layer; and
a color filter disposed between the second insulating layer and the first insulating layer; and
the color filter is disposed on the display area.

6. The display device of claim 5, wherein:
the first substrate further comprises a first column spacer disposed on a same layer as the color filter and overlapping the lower pad; and
the second substrate further comprises a second column spacer disposed between the first column spacer and the upper pad.

7. The display device of claim 6, wherein the first column spacer is in direct contact with the second column spacer.

8. The display device of claim 6, wherein outer surfaces of the first column spacer and the second column spacer are located more to an inside than outer surfaces of the upper pad and the lower pad.

9. The display device of claim 8, wherein the side pad is in direct contact with the outer surface of the first column spacer and the outer surface of the second column spacer.

10. The display device of claim 9, wherein the first lower pad is in direct contact with the second lower pad.

11. The display device of claim 6, wherein the first substrate further comprises a third conductive layer disposed on the second conductive layer and comprising a pixel electrode defining each pixel in the display area.

12. The display device of claim 11, wherein:
the first substrate further comprises a connection electrode disposed between the sealing member and the second insulating layer, and the third conductive layer comprises the connection electrode; and
the connection electrode penetrates through the second insulating layer and the first insulating layer to be connected to the first lower pad.

13. The display device of claim 12, wherein the conductive balls of the sealing member electrically connect the connection electrode with the upper pad.

14. The display device of claim 13, wherein:
the lower pad further comprises a third lower pad disposed between the first column spacer and the second column spacer; and
the third conductive layer further comprises the third lower pad.

15. The display device of claim 6, wherein the second insulating layer is extended to between the first column spacer and the second lower pad.

16. The display device of claim 15, wherein:
the lower pad further comprises a third lower pad disposed between the first column spacer and the second column spacer; and
the third lower pad is connected to the second lower pad through a contact hole formed through the second insulating layer.

17. The display device of claim 16, wherein the second lower pad is connected to the first lower pad through a contact hole penetrating through the first insulating layer.

18. The display device of claim 3, wherein:
the second substrate further comprises a common electrode disposed on the second base substrate; and the common electrode and the upper pad are disposed on the same layer and are spaced apart from each other.

19. A display device comprising:
a first substrate comprising:
  a first base substrate;
  a first conductive layer disposed on the first base substrate and comprising a gate electrode of a thin-film transistor and a first lower pad;
  a first insulating layer disposed on the first conductive layer;
  a second conductive layer disposed on the first insulating layer and comprising a source electrode and a drain electrode of the thin-film transistor, and a second lower pad disposed on the first lower pad;
  a second insulating layer disposed on the second conductive layer; and
  a third conductive layer disposed on the second insulating layer and comprising a pixel electrode connected to the source electrode or the drain electrode of the thin-film transistor; and
a second substrate disposed above the first substrate and comprising a second base substrate and an upper pad disposed on the second base substrate; a side pad electrically connected to the lower pad and the upper pad; and a sealing member disposed between the first substrate and the second substrate,
wherein:
  the sealing member comprises an insulating resin and conductive balls dispersed in the insulating resin;
  the first substrate further comprises a connection electrode disposed between the sealing member and the second insulating layer;
  the connection electrode is be connected to the first lower pad through the second insulating layer and the first insulating layer; and
  the connection electrode and the upper pad are electrically connected to each other through the conductive balls.

20. The display device of claim 19, further comprising a printed circuit board attached to the side pad.

21. The display device of claim 19, wherein the connection electrode is disposed on a same layer as the pixel electrode.

* * * * *